United States Patent
Noda

(10) Patent No.: US 9,401,332 B2
(45) Date of Patent: Jul. 26, 2016

(54) METHOD FOR MANUFACTURING SEMICONDUCTOR DEVICE AND ALIGNMENT MARK OF SEMICONDUCTOR DEVICE

(71) Applicant: Kabushiki Kaisha Toshiba, Minato-ku (JP)

(72) Inventor: Kotaro Noda, Mie-ken (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 136 days.

(21) Appl. No.: 14/197,548

(22) Filed: Mar. 5, 2014

(65) Prior Publication Data

US 2015/0145150 A1     May 28, 2015

Related U.S. Application Data

(60) Provisional application No. 61/907,649, filed on Nov. 22, 2013.

(51) Int. Cl.
    *H01L 23/544* (2006.01)

(52) U.S. Cl.
    CPC ....... *H01L 23/544* (2013.01); *H01L 2223/5442* (2013.01); *H01L 2223/5446* (2013.01); *H01L 2223/54426* (2013.01); *H01L 2924/0002* (2013.01)

(58) Field of Classification Search
    CPC ... H01L 23/544; H01L 21/033; H01L 21/308; H01L 2223/54426; G03F 9/7076
    USPC .......................... 257/797; 438/401
    See application file for complete search history.

(56) References Cited

U.S. PATENT DOCUMENTS

| | | | |
|---|---|---|---|
| 6,656,645 B2 | 12/2003 | Tanaka et al. | |
| 6,667,135 B2 | 12/2003 | Tanaka et al. | |
| 6,686,099 B2 | 2/2004 | Tanaka et al. | |
| 2006/0284175 A1* | 12/2006 | Hiramatsu | H01L 21/02422 257/57 |
| 2013/0009328 A1* | 1/2013 | Wang | H01L 23/544 257/797 |
| 2014/0035171 A1* | 2/2014 | Yang | H01L 23/544 257/797 |

FOREIGN PATENT DOCUMENTS

| JP | 2-229419 | 9/1990 |
|---|---|---|
| JP | 9-232207 | 9/1997 |
| JP | 11-121321 | 4/1999 |
| JP | 11-354415 | 12/1999 |

* cited by examiner

*Primary Examiner* — Tu-Tu Ho
(74) *Attorney, Agent, or Firm* — Oblon, McClelland, Maier & Neustadt, L.L.P

(57) ABSTRACT

According to one embodiment, a method is disclosed for manufacturing a semiconductor device. The method can include forming a stacked layer in a memory cell region and a mark region, forming a first mask layer above the stacked layer, and forming a second mask layer above the first mask layer; forming the second mask layer into first mask pattern features and forming a first alignment mark pattern feature; forming second mask pattern features and then removing the first mask pattern features; opening part of the second mask pattern features and forming a third mask layer having an opening; removing part of the second mask pattern features; removing the third mask layer; forming a fourth mask layer; etching the first mask layer; removing the fourth mask layer and then removing the second mask pattern features; and etching the stacked layer.

5 Claims, 32 Drawing Sheets

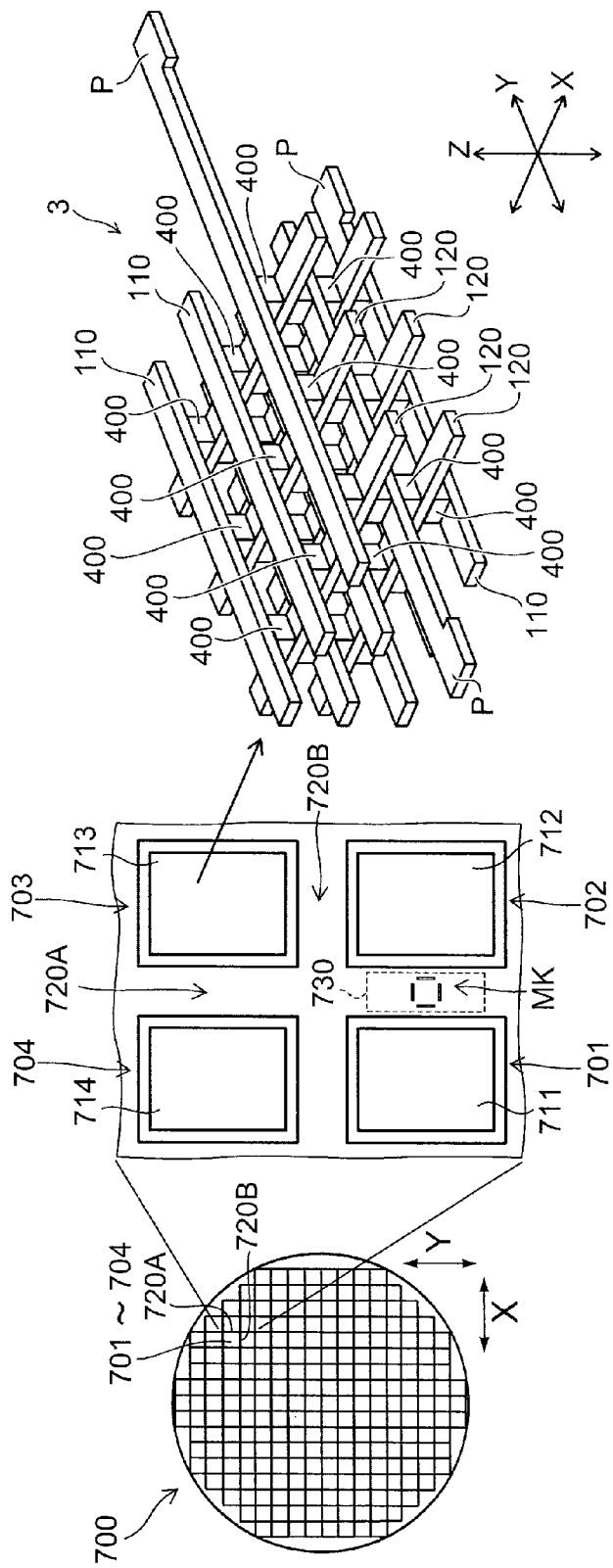

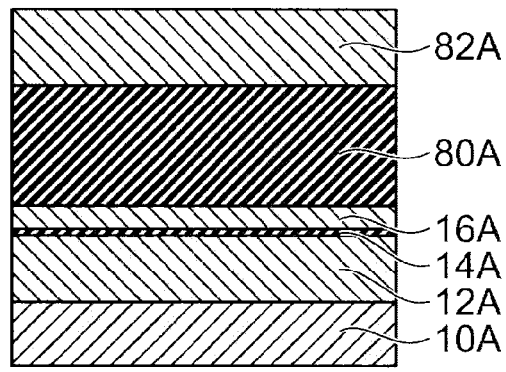
FIG. 2A
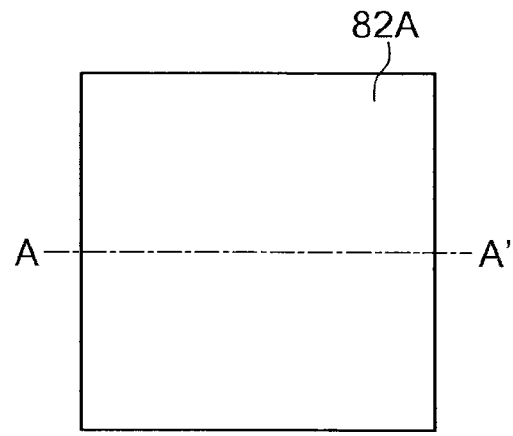
FIG. 2B
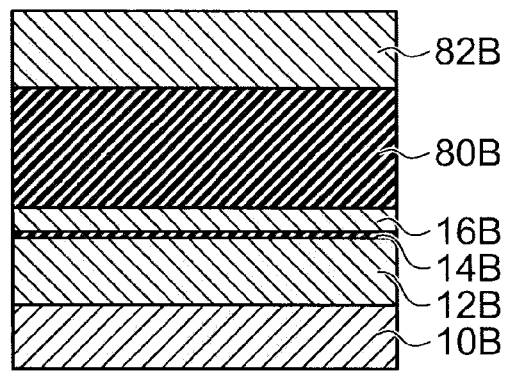
FIG. 2C
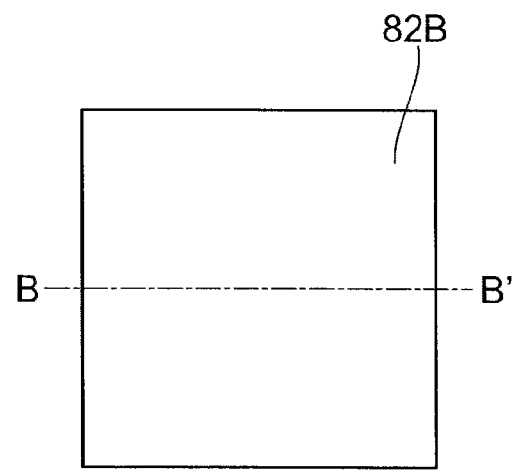
FIG. 2D
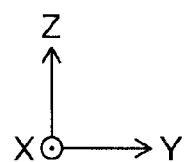
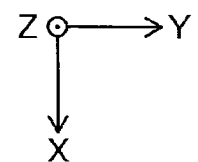

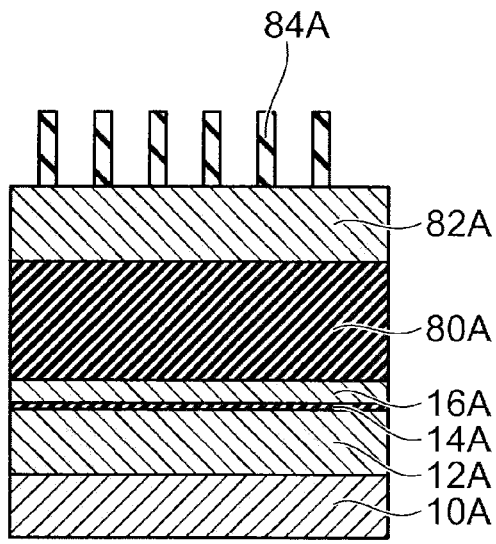
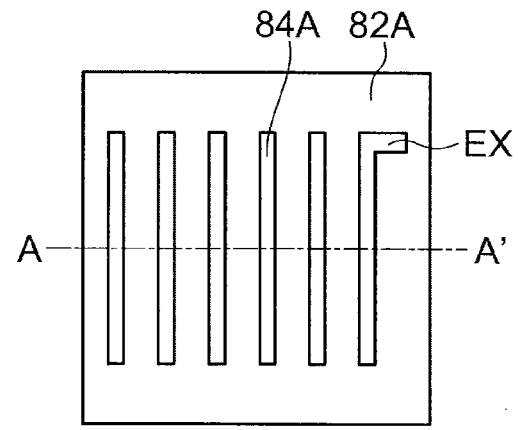
FIG. 3A    FIG. 3B
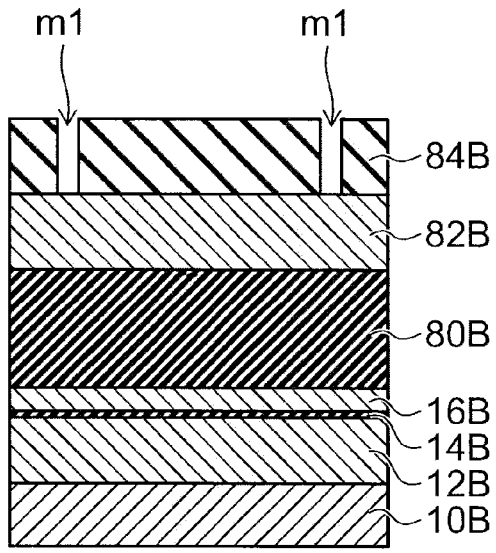
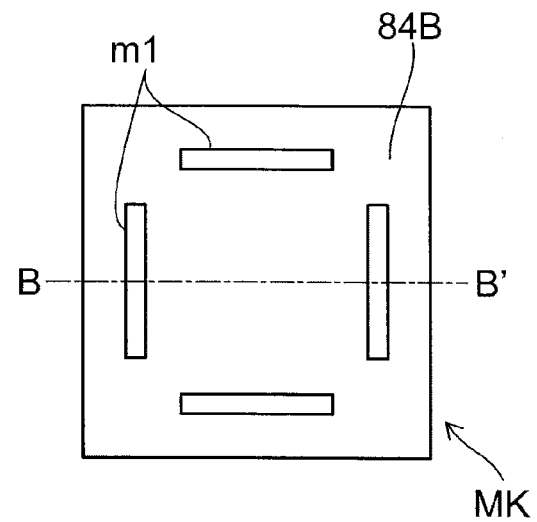
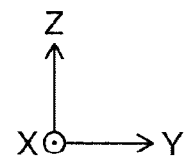
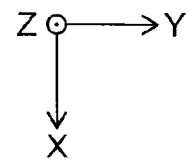
FIG. 3C    FIG. 3D

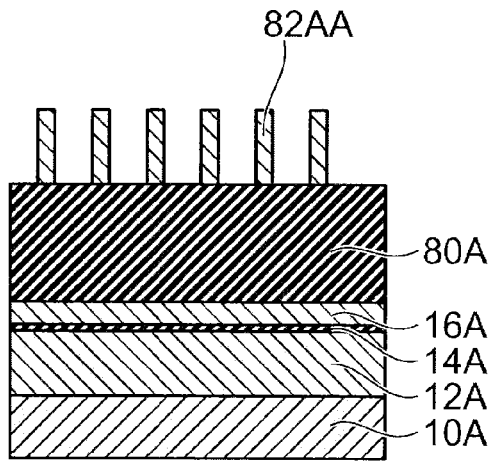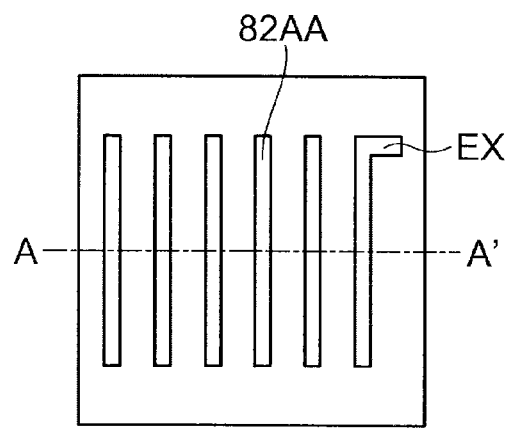
FIG. 4A  FIG. 4B
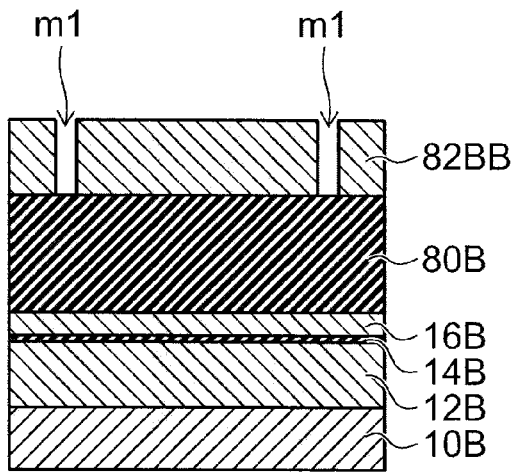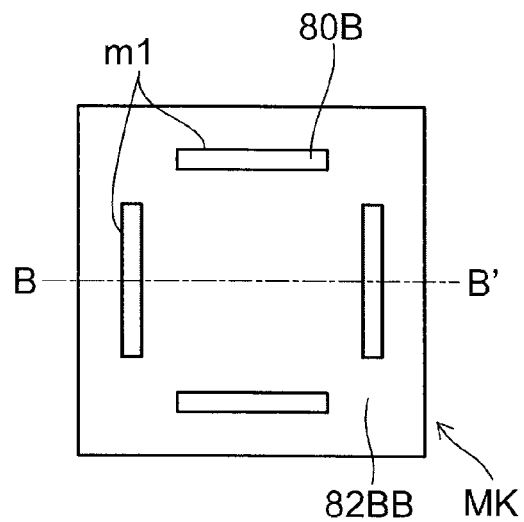
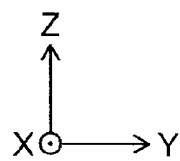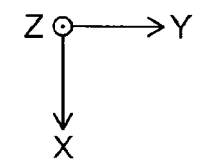
FIG. 4C  FIG. 4D

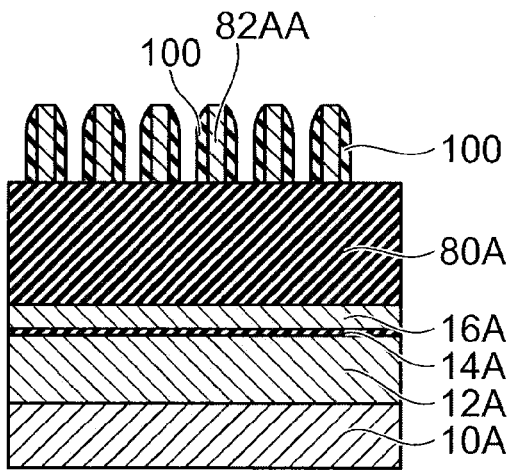
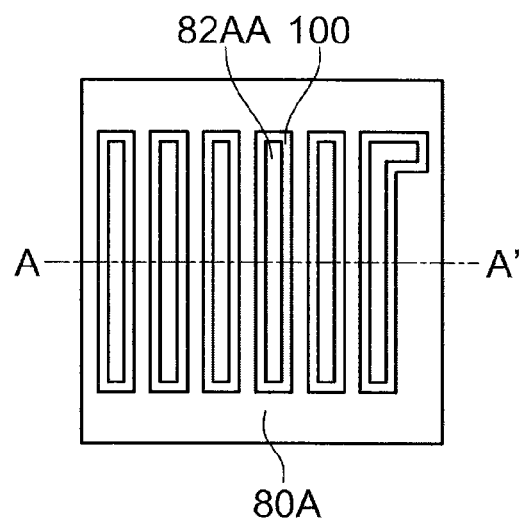
FIG. 5A
FIG. 5B
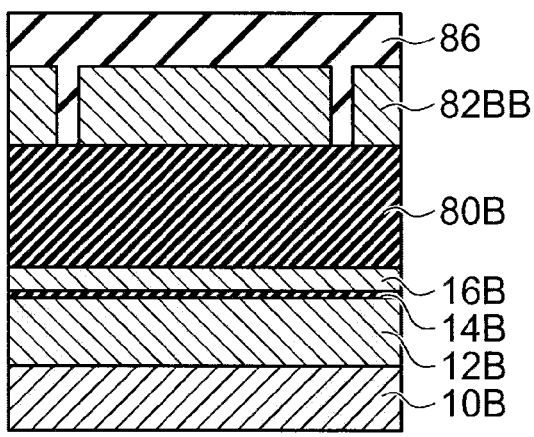
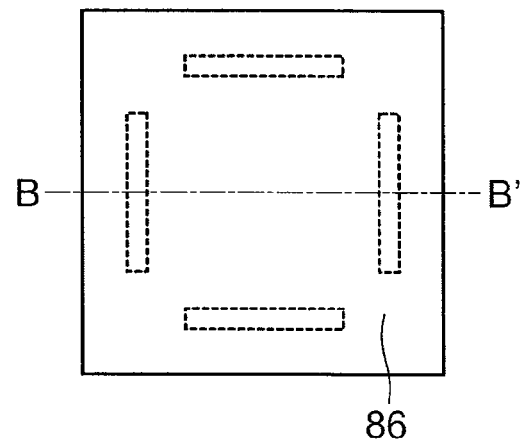
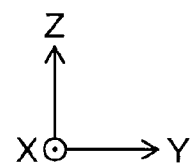
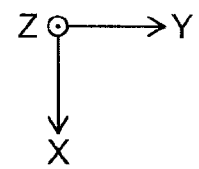
FIG. 5C
FIG. 5D

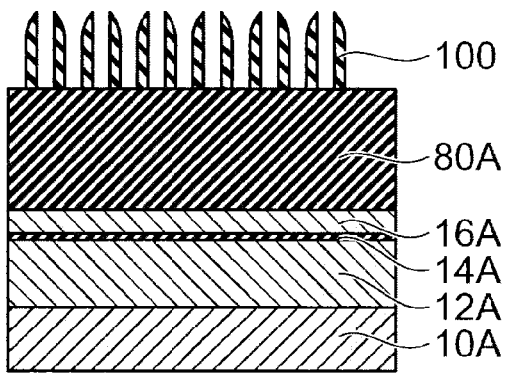
FIG. 6A
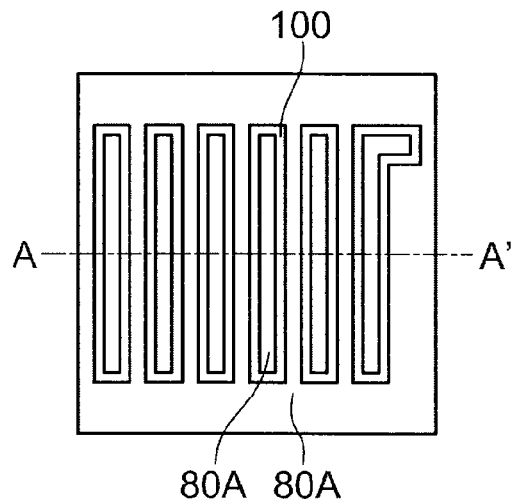
FIG. 6B
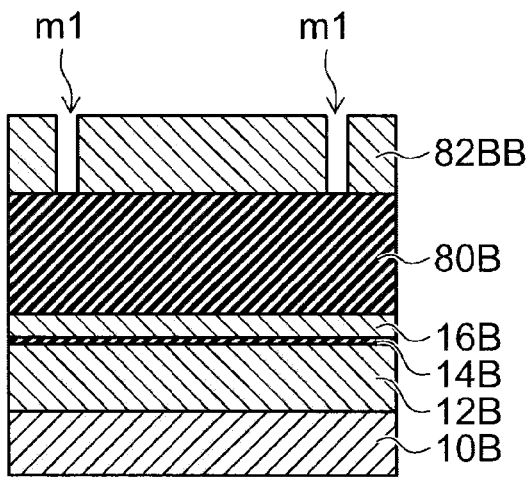
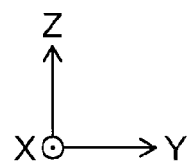
FIG. 6C
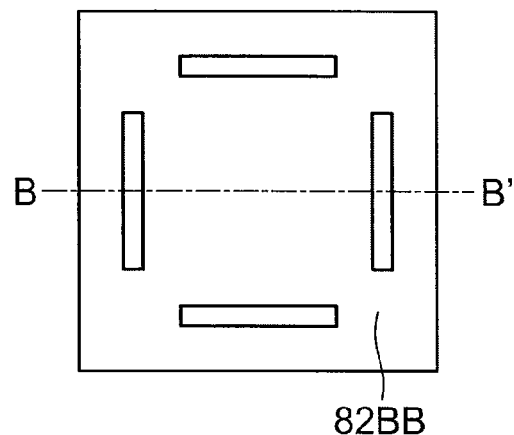
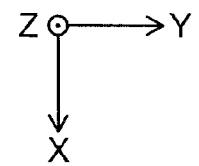
FIG. 6D

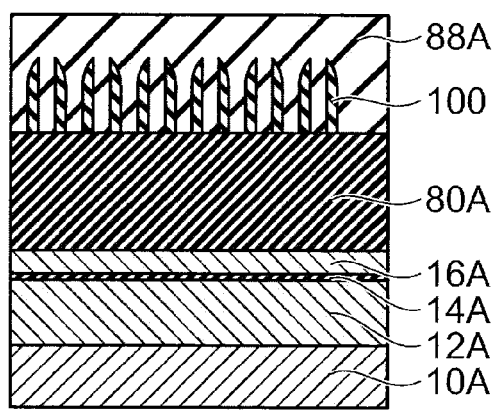
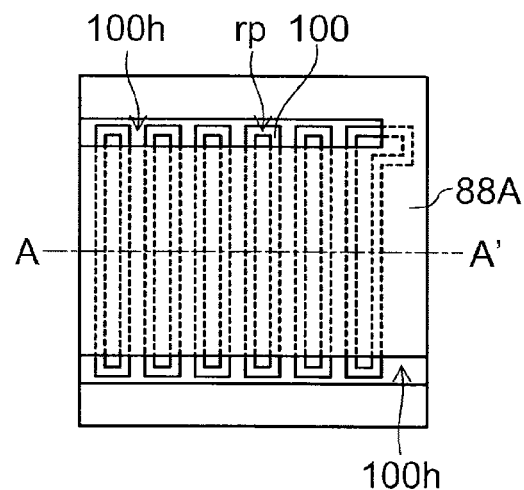
FIG. 7A  FIG. 7B
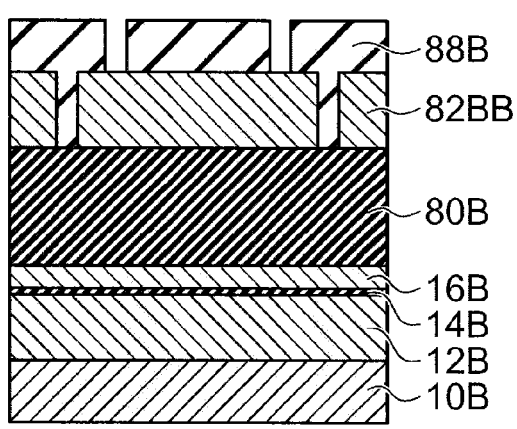
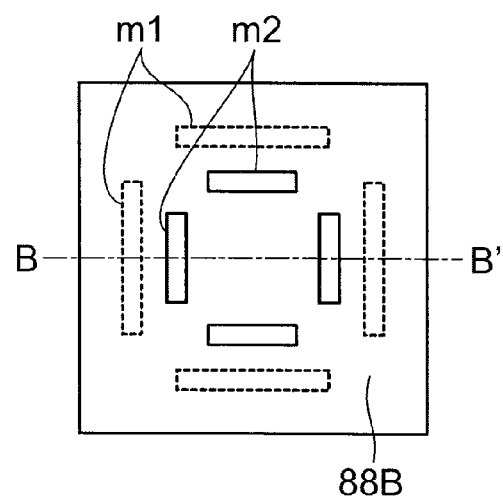
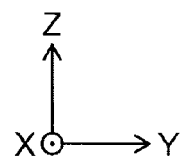
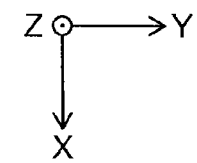
FIG. 7C  FIG. 7D

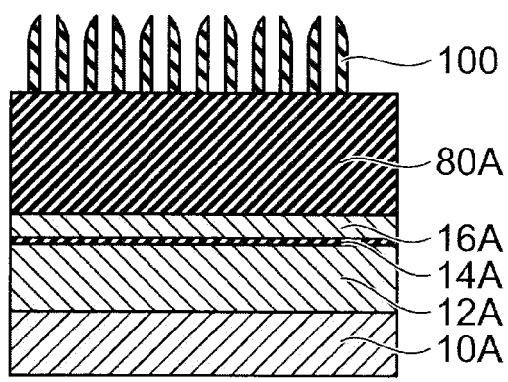
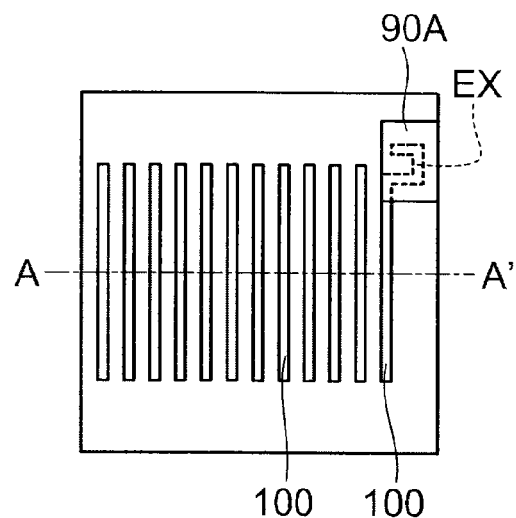
FIG. 9A
FIG. 9B
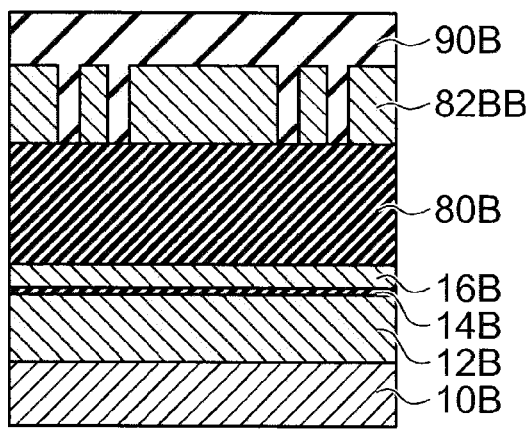
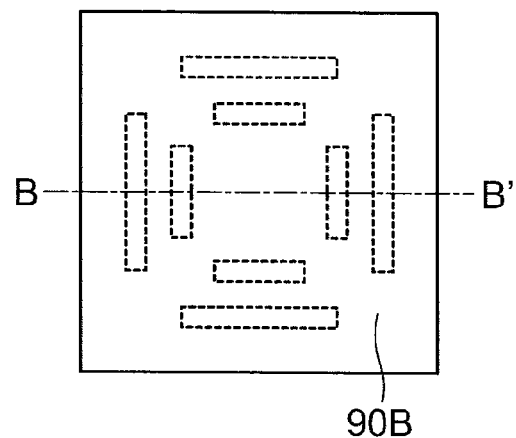
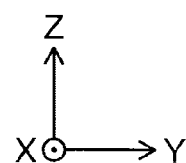
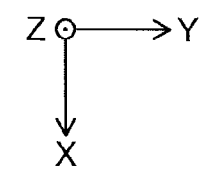
FIG. 9C
FIG. 9D

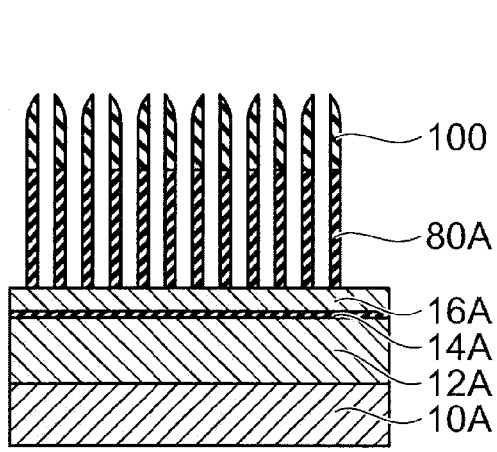
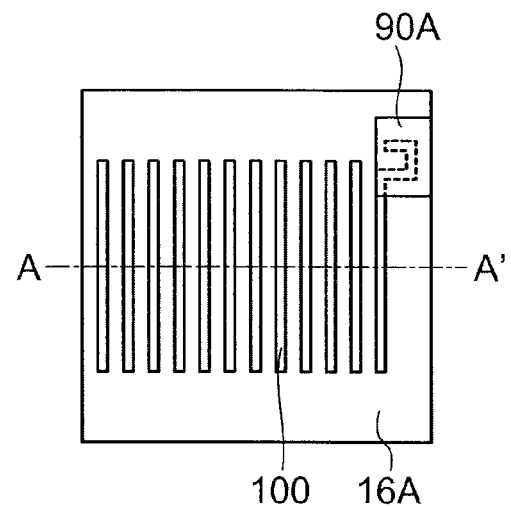
FIG. 10A
FIG. 10B
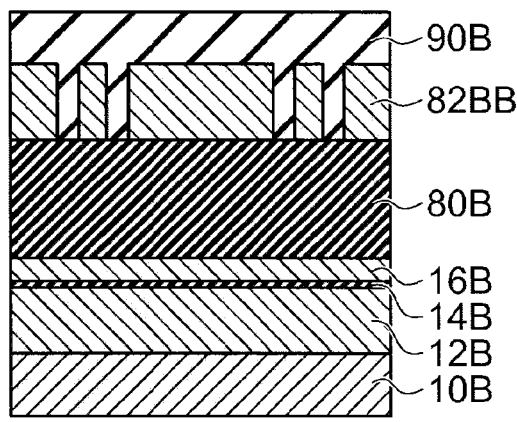
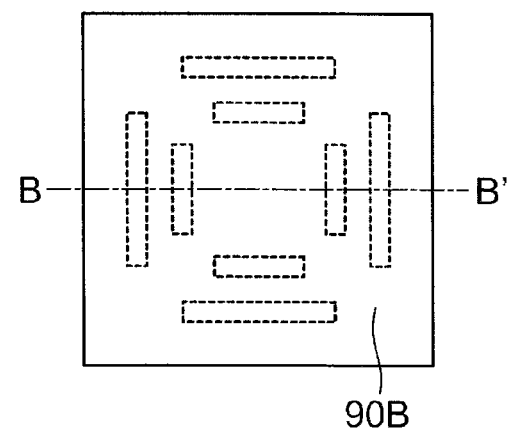
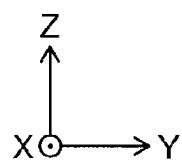
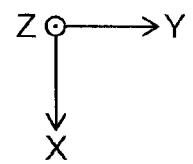
FIG. 10C
FIG. 10D

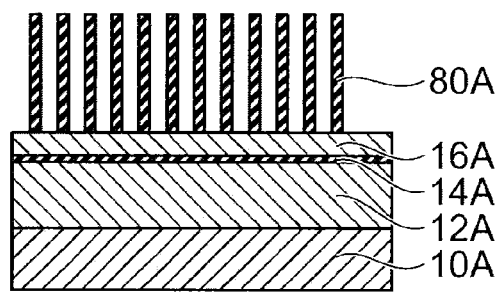
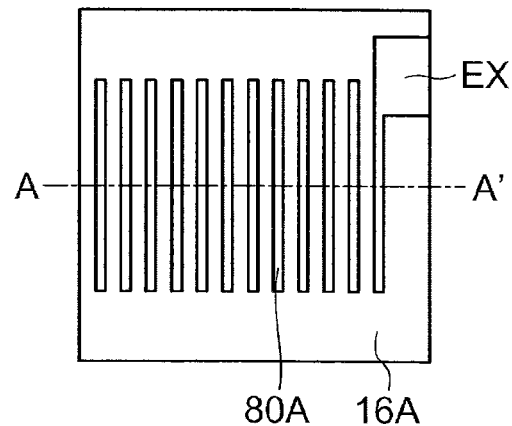
FIG. 11A
FIG. 11B
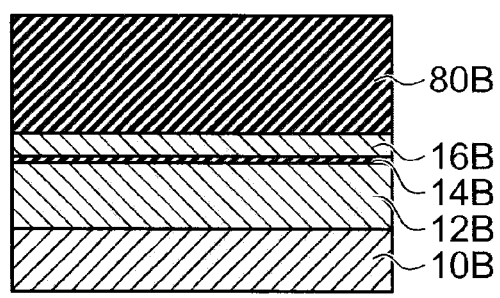
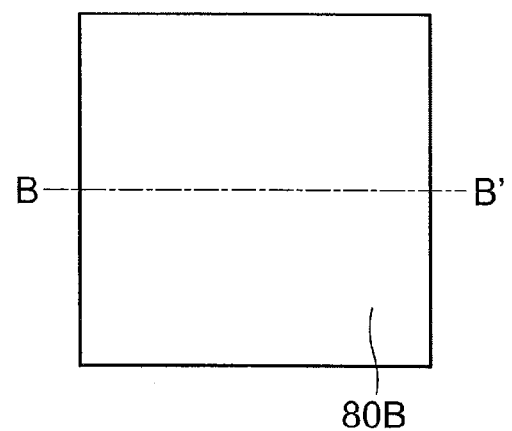
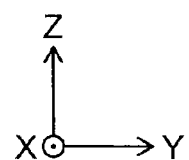
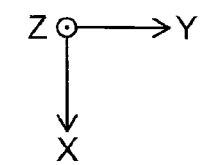
FIG. 11C
FIG. 11D

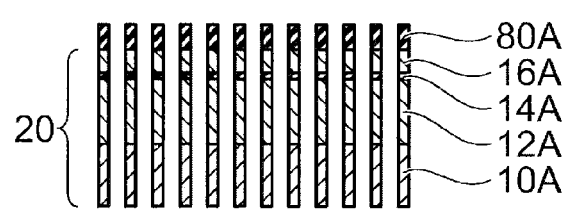
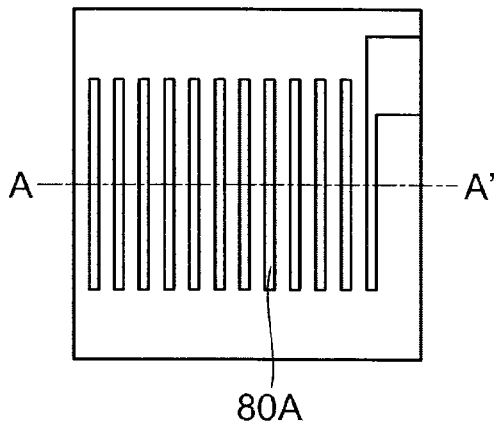
FIG. 12A  FIG. 12B
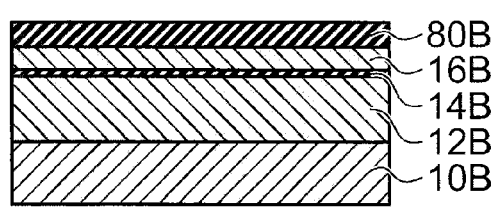
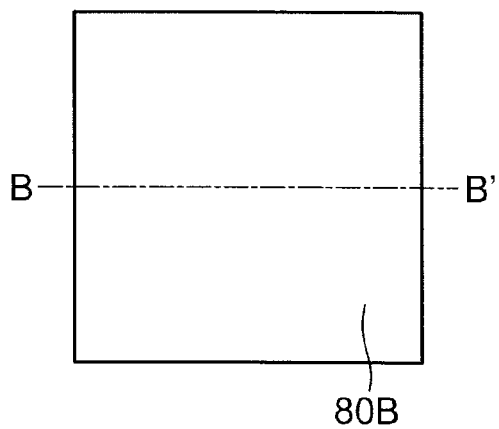
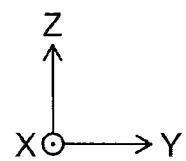
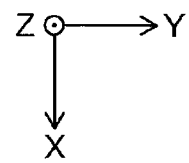
FIG. 12C  FIG. 12D

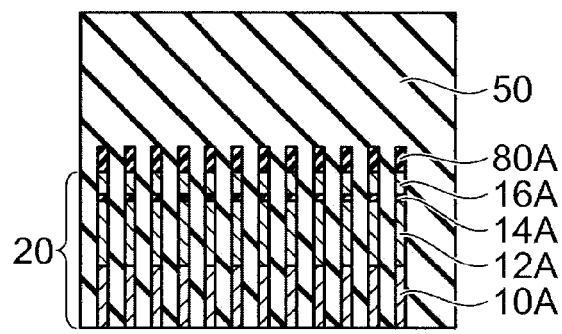
FIG. 13A
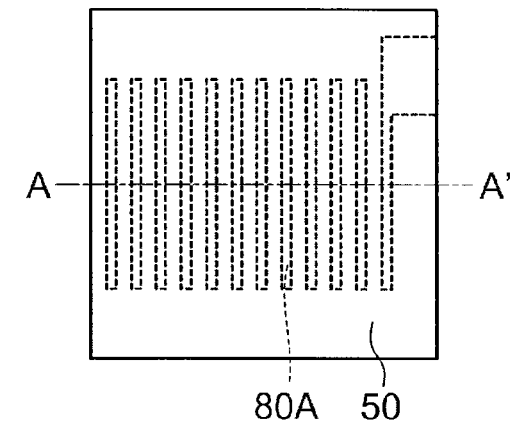
FIG. 13B
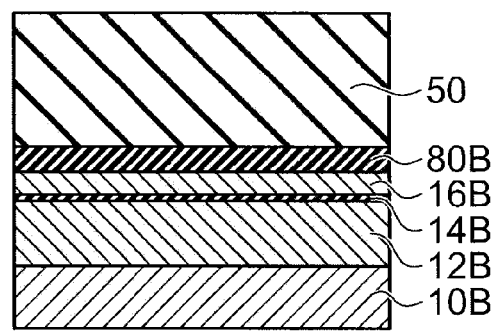
FIG. 13C
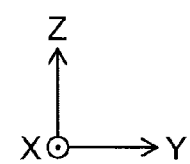
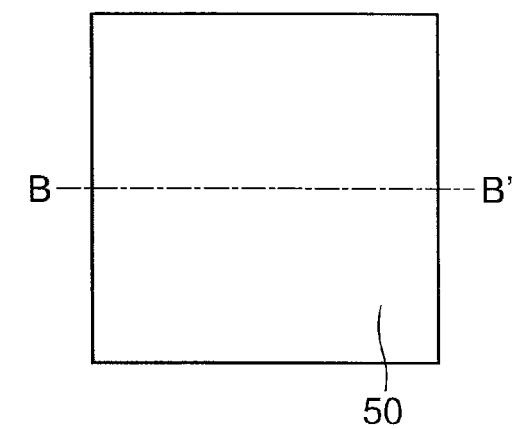
FIG. 13D
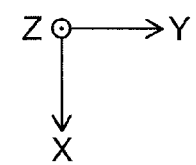

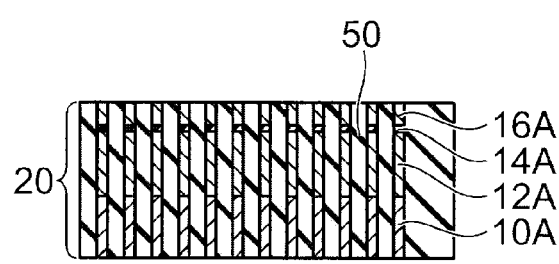
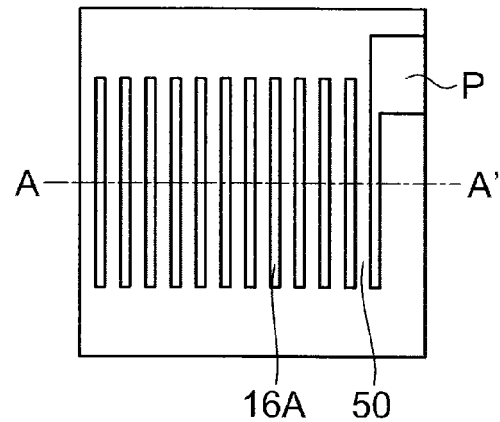
FIG. 14A
FIG. 14B
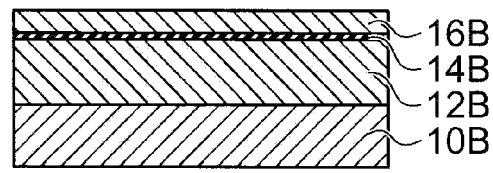
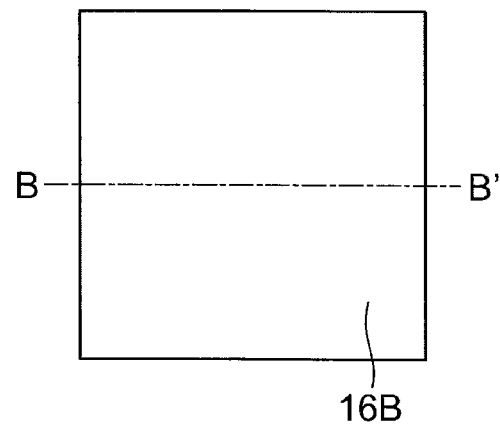
FIG. 14C
FIG. 14D

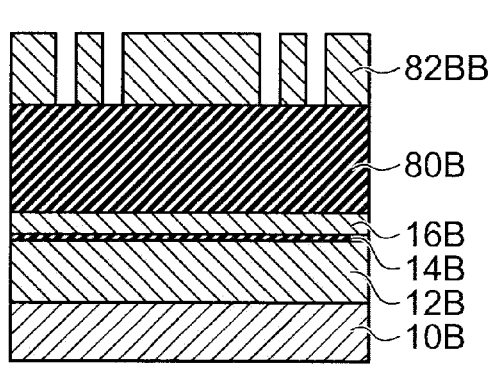
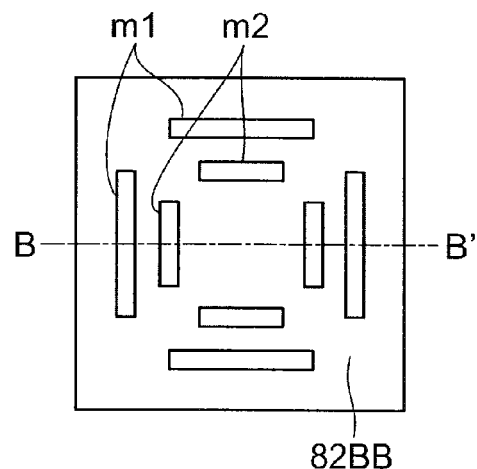
FIG. 15A      FIG. 15B
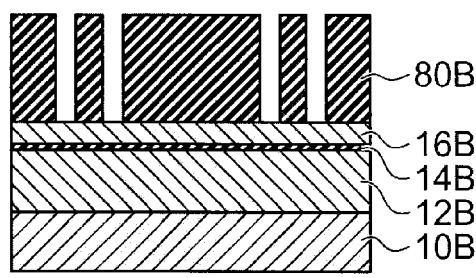
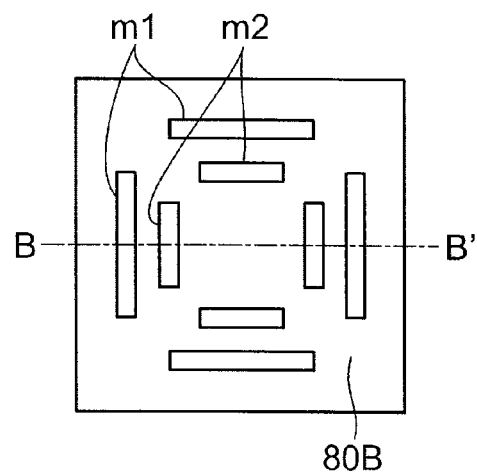
FIG. 16A      FIG. 16B

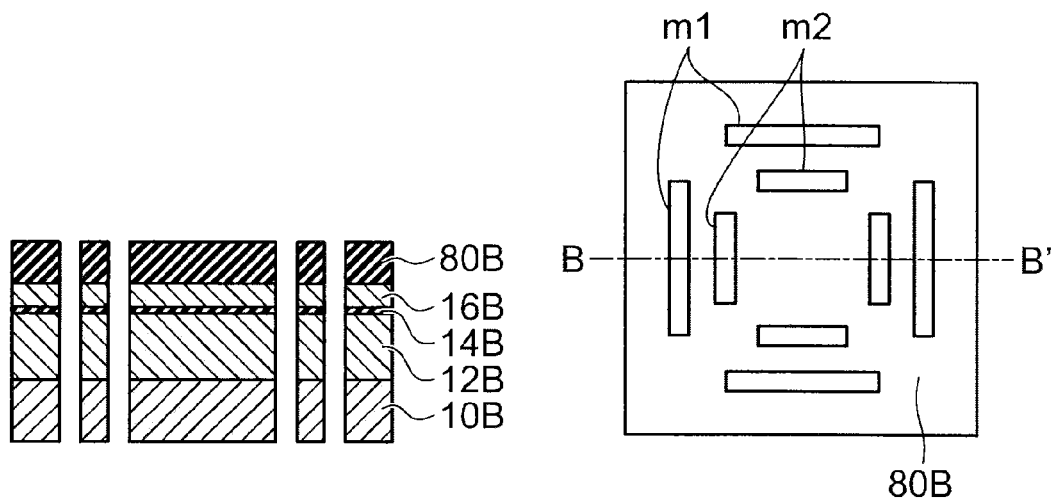
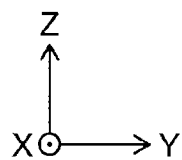
FIG. 17A
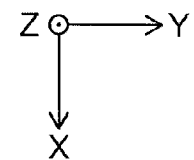
FIG. 17B
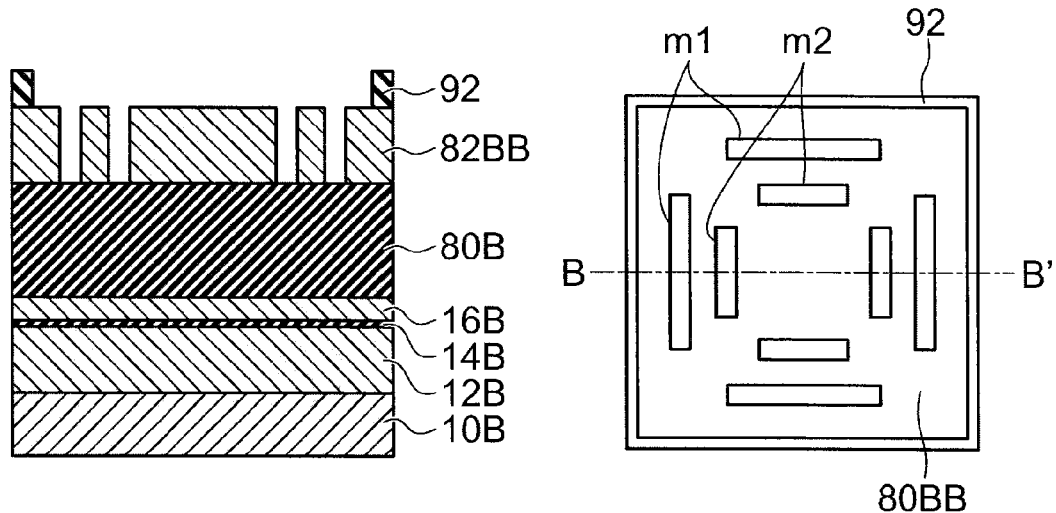
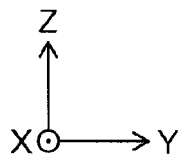
FIG. 18A
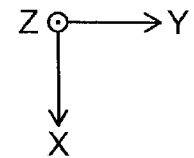
FIG. 18B

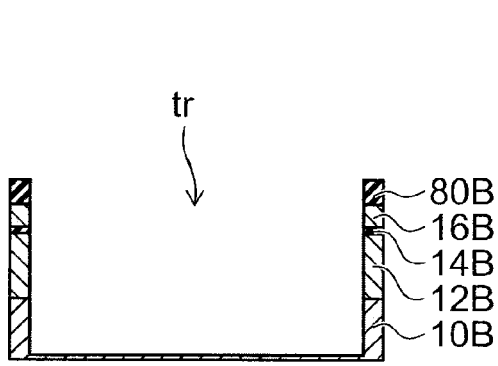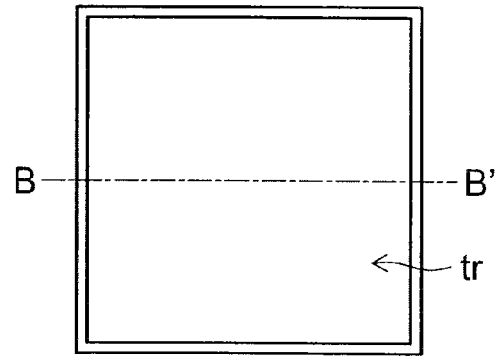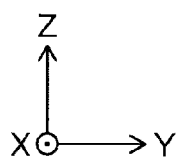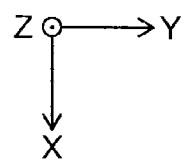
FIG. 21A                    FIG. 21B
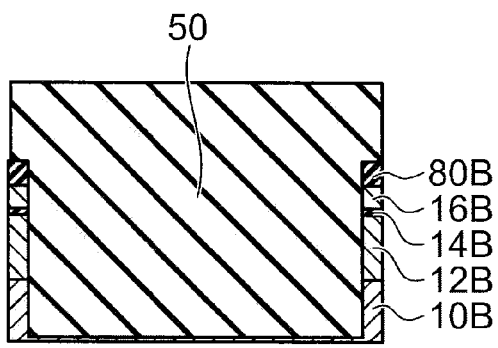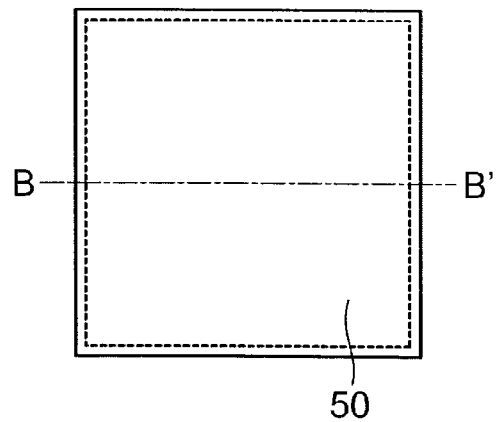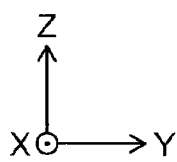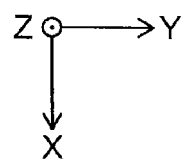
FIG. 22A                    FIG. 22B

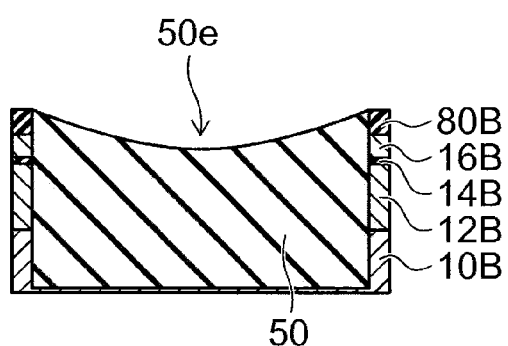
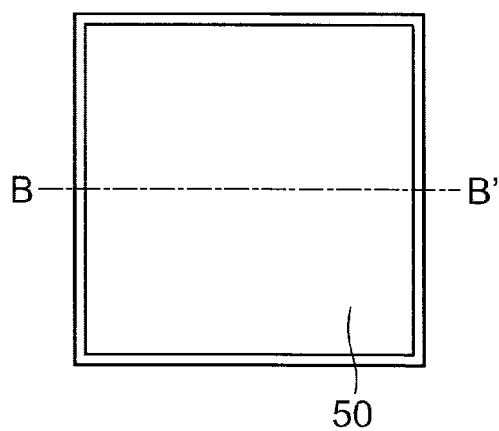
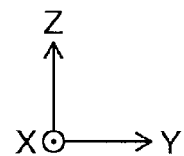
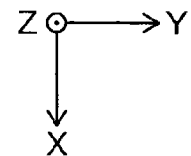
FIG. 23A
FIG. 23B

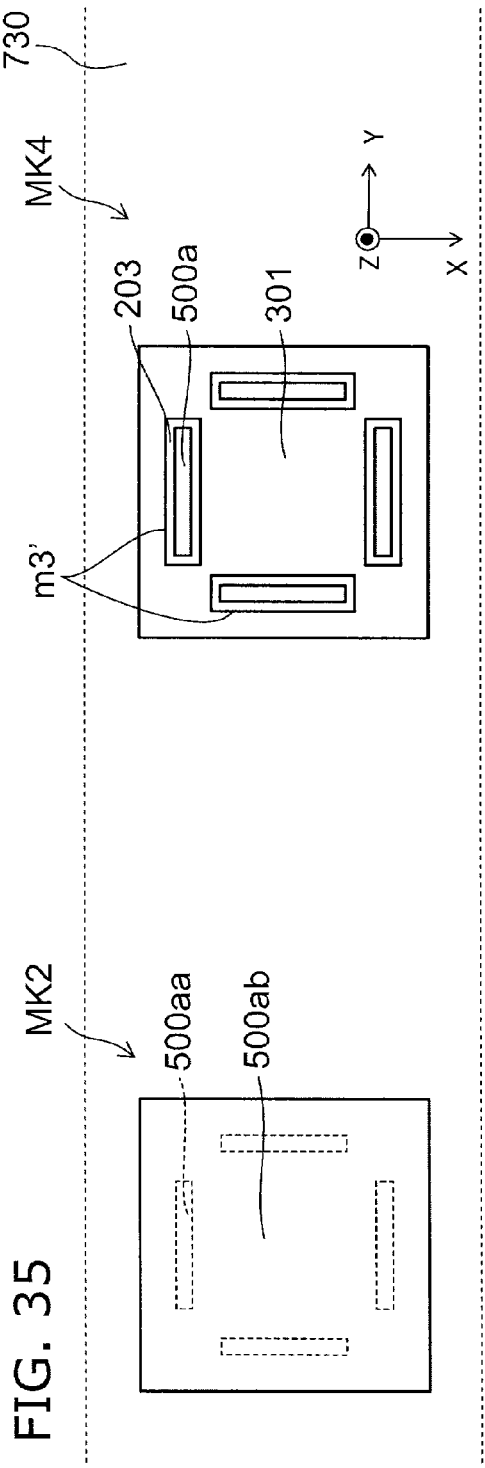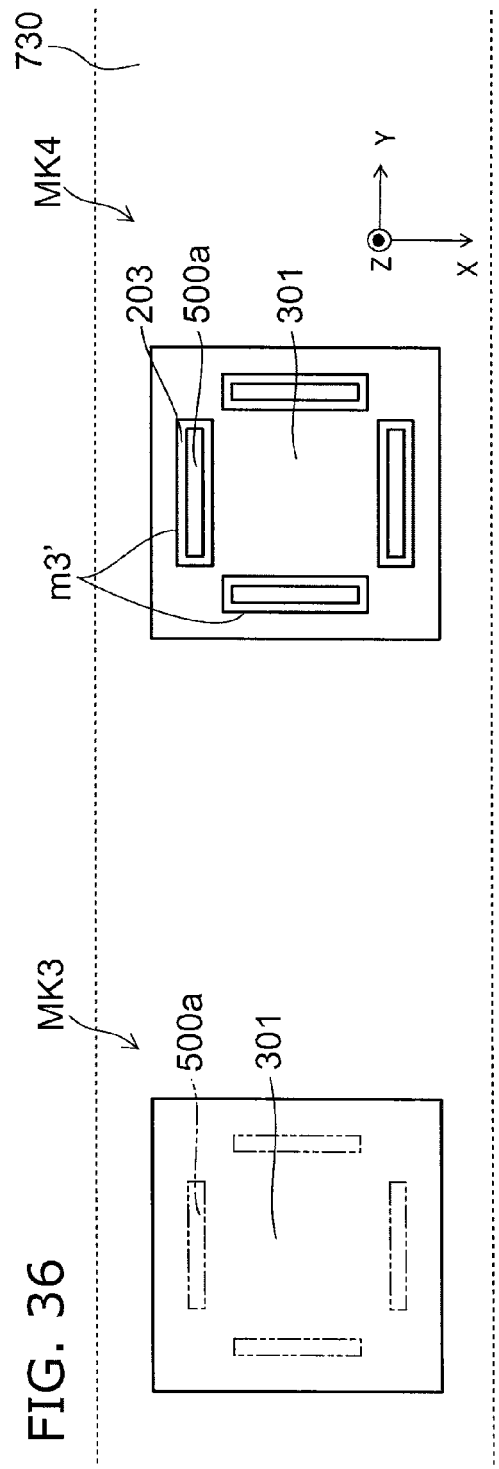

METHOD FOR MANUFACTURING SEMICONDUCTOR DEVICE AND ALIGNMENT MARK OF SEMICONDUCTOR DEVICE

CROSS-REFERENCE TO RELATED APPLICATIONS

This application is based upon and claims the benefit of priority from U.S. Provisional Patent Application 61/907,649, filed on Nov. 22, 2013; the entire contents of which are incorporated herein by reference.

FIELD

Embodiments described herein relate generally to a method for manufacturing a semiconductor device and an alignment mark of the semiconductor device.

BACKGROUND

Nonvolatile memory devices having multiple-layer structures have been devised in order to improve the integration degree. In such nonvolatile memory devices, the number of photolithography processes tends to increase. In each photolithography process, alignment marks are used to make alignment between a mask and an underlayer pattern. If the marks used in each photolithography process are formed in a region different from the other photolithography processes, the area of the mark region is increased. As a result, the karf area (dicing area) of a wafer is increased.

BRIEF DESCRIPTION OF THE DRAWINGS

FIG. 1A is a plan view of a semiconductor wafer in which nonvolatile memory devices according to the first embodiment are provided, FIG. 1B is an enlarged view of part of the semiconductor wafer plane, and FIG. 1C is a schematic stereo view of part of a memory cell region, FIG. 2A to FIG. 14D are schematic views showing the manufacturing process of the nonvolatile memory device according to the first embodiment;

FIG. 15A to FIG. 17B are schematic views showing the manufacturing process of a mark region of a nonvolatile memory device according to a reference example 1;

FIG. 18A to FIG. 23B are schematic views showing the manufacturing process of the mark region of a nonvolatile memory device according to a reference example 2;

FIG. 34A to FIG. 36 are schematic plan views showing the manufacturing process of the nonvolatile memory device according to the fourth embodiment.

DETAILED DESCRIPTION

Figure 8A:
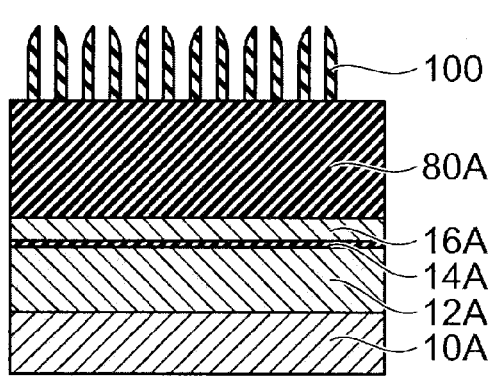

According to one embodiment, a method is disclosed for manufacturing a semiconductor device. The method can include forming a stacked layer in a memory cell region and a mark region, forming a first mask layer above the stacked layer, and forming a second mask layer above the first mask layer; forming the second mask layer into first mask pattern features in the memory cell region and forming a first alignment mark pattern feature in the second mask layer in the mark region; forming second mask pattern features in contact with side surfaces of the first mask pattern features and then removing the first mask pattern features in the memory cell region; opening part of the second mask pattern features in the memory cell region by using the first alignment mark pattern feature and forming a third mask layer having an opening corresponding to the first alignment mark pattern feature in the mark region; removing part of the second mask pattern features exposed by the opening; removing the third mask layer; forming a fourth mask layer covering the second mask layer in the mark region; etching the first mask layer by using the fourth mask layer and the second mask pattern features as a mask; removing the fourth mask layer and then removing the second mask pattern features; and etching the stacked layer using the first mask layer as a mask.

Various embodiments will be described hereinafter with reference to the accompanying drawings. In the following description, identical components are marked with the same reference numerals, and a description of components once described is omitted as appropriate.

First Embodiment

A first embodiment illustrates the manufacturing process of a nonvolatile memory device including a resistance change film (ReRAM (resistance random access memory)).

FIG. 1A is a plan view of a semiconductor wafer in which nonvolatile memory devices according to the first embodiment are provided, FIG. 1B is an enlarged view of part of the semiconductor wafer plane, and FIG. 1C is a schematic stereo view of part of a memory cell region.

Semiconductor chip areas 701 to 704 are provided on a semiconductor wafer 700 (hereinafter, a wafer 700) such as a silicon wafer. Element regions 711 to 714 in which nonvolatile memory devices having a three-dimensional structure are arranged are provided in the semiconductor chip areas 701 to 704, respectively. In the element regions 711 to 714, elements of transistors, memory cells, resistance elements, or the like, an interlayer insulating film covering these elements, etc. are formed three-dimensionally.

In order to make the semiconductor chip areas 701 to 704 on the wafer 700 into independent chips, dicing areas 720A and 720B are provided between the semiconductor chip areas 701 to 704 adjacent in the X-direction or the Y-direction. The wafer 700 is cut along the dicing areas 720A and 720B, and the semiconductor chip areas 701 to 704 each become one memory chip.

A mark region 730 is provided in the dicing area 720A extending in the Y-direction, as an example. A mark portion MK for alignment (described later) for detecting the positions of a mask and the wafer 700 is provided in the mark region 730.

FIG. 1C shows a memory cell array 3 provided in one of the element regions 71₁ to 71₄. Herein, a portion where a memory cell array 3 of 3 rows×3 columns is stacked in four layers is shown as an example.

The memory cell array 3 includes first interconnections 110 and second interconnections 120. The memory cell array 3 includes memory cells 400 in a substantially columnar shape (hereinafter, simply referred to as a "columnar shape") provided between the first interconnection 110 and the second interconnection 120. One of the first interconnection and the second interconnection is a bit line, for example, and the other is a word line.

The first interconnection 110 and the second interconnection 120 cross each other three-dimensionally in a non-parallel manner. For example, the first interconnection 110 extends in a first direction (the Y-direction) and the second interconnection 120 extends in a second direction (the X-direction) orthogonal to the first direction; thus, the first interconnection 110 and the second interconnection 120 are orthogonal. Each of memory cells 400 is provided at the cross point where the first interconnection 110 and the second interconnection 120 cross each other.

The memory cells 400 are arranged in two-dimensional directions (the XY directions) in a matrix configuration, for example, and the array of the matrix configuration is stacked in plural in a third direction (the Z-direction) orthogonal to the XY plane. The first interconnection 110 is shared between the over- and underlying memory cells 400. Similarly, the second interconnection 120 is shared between the over- and underlying memory cells 400.

A contact region P is disposed in an end portion of the first interconnection 110. The contact regions P are arranged so as not to overlap in the Z-direction. The contact region P may be disposed also in an end portion of the second interconnection.

FIG. 2A to FIG. 15D are schematic views showing the manufacturing process of the nonvolatile memory device according to the first embodiment.

Here, the drawings of the numbers including "A" show schematic cross-sectional views of the memory cell region, and the drawings of the numbers including "B" show schematic plan views of the memory cell region. The drawings of the numbers including "A" show a cross-sectional view taken along line A-A' of the drawings of the numbers including "B". The drawings of the numbers including "C" show schematic cross-sectional views of a region where a mark for alignment is disposed, and the drawings of the numbers including "D" show schematic plan views of the mark region for alignment. The drawings of the numbers including "C" show a cross-sectional view taken along line B-B' of the drawings of the numbers including "D".

In the first embodiment, a region of the nonvolatile memory device including a resistance change film is referred to as the memory cell region. The resistance change film may be referred to as a memory layer as a general term.

First, as shown in FIG. 2A and FIG. 2B, in the memory cell region, a silicon-containing layer 12A is formed above a metal-containing layer 10A. A resistance change film 14A is formed above the silicon-containing layer 12A. A metal-containing layer 16A is formed above the resistance change film 14A, and a mask layer 80A of a silicon oxide layer or the like is formed above the metal-containing layer 16A. A silicon-containing layer 82A is formed on the mask layer 80A.

As shown in FIG. 2C and FIG. 2D, in the mark region, a silicon-containing layer 12B is formed above a metal-containing layer 10B, and a resistance change film 14B is formed above the silicon-containing layer 12B. A metal-containing layer 16B is formed above the resistance change film 14B, and a mask layer 80B of a silicon oxide layer or the like is formed above the metal-containing layer 16B. A silicon-containing layer 82B is formed above the mask layer 80B.

Here, the metal-containing layer 10A and the metal-containing layer 10B, the silicon-containing layer 12A and the silicon-containing layer 12B, the resistance change film 14A and the resistance change film 14B, the metal-containing layer 16A and the metal-containing layer 16B, the mask layer 80A and the mask layer 80B, and the silicon-containing layer 82A and the silicon-containing layer 82B shown in FIG. 2A and FIG. 2C can be formed simultaneously in the manufacturing process.

The metal-containing layer 10A, the silicon-containing layer 12A, the resistance change film 14A, and the metal-containing layer 16A in the memory cell region and the metal-containing layer 10B, the silicon-containing layer 12B, the resistance change film 14B, and the metal-containing layer 16B in the mark region are collectively referred to as a stacked body. The silicon-containing layers 82A and 82B function as mask layers.

Next, as shown in FIG. 3A and FIG. 3B, in the memory cell region, mask pattern features 84A are formed on the silicon-containing layer 82A by photolithography and anisotropic etching. The mask pattern features 84A extend in the X-direction, and are arranged in the Y-direction crossing the X-direction. One of the mask pattern features 84A may have an extending portion EX extending in the Y-direction from an end portion of the mask pattern feature 84A. The silicon-containing layer 82A not covered with the mask pattern feature 84A is exposed from the mask pattern feature 84A.

As shown in FIG. 3C and FIG. 3D, in the mark region, a mask pattern feature 84B to which an alignment mark portion MK (hereinafter, simply a mark portion MK) has been transferred is formed above the silicon-containing layer 82B by photolithography and anisotropic etching. Here, the mark portion MK has four mark pattern features m1 (hereinafter, simply marks m1), for example. The mark m1 has an opening, and the silicon-containing layer 82B is opened from the mask pattern feature 84B via the opening of the mark m1.

Subsequently, the mask pattern features 84A and 84b are used as a mask to perform the RIE (reactive ion etching) method. The RIE method in the memory cell region and the mark region can be performed simultaneously. The state after the RIE method is shown in FIG. 4A and FIG. 4B.

As shown in FIG. 4A and FIG. 4B, in the memory cell region, mask pattern features 82AA obtained by the silicon-containing layer 82A being processed by the RIE method are formed above the mask layer 80A. The mask pattern features 82AA extend in the X-direction, and are arranged in the Y-direction crossing the X-direction.

As shown in FIG. 4C and FIG. 4D, in the mark region, a mask pattern feature 82BB obtained by the silicon-containing layer 82A being processed by the RIE method is formed above the mask layer 80B. The mark m1 has been transferred to the mask pattern feature 82BB. The mask layer 80B is opened from the mark m1.

After that, slimming processing for narrowing the width in the Y-direction may be performed on the mask pattern feature 82AA.

Next, as shown in FIG. 5A and FIG. 5B, in the memory cell region, a silicon nitride film 100 in contact with the side surface of the mask pattern feature 82AA, for example, is formed. For example, a silicon nitride film 100 is formed along the upper surface and the side surface of the mask pattern feature 82AA, and then anisotropic RIE method processing is performed on the silicon nitride film 100; thereby, the silicon nitride film 100 shown in FIG. 5A is formed. The mark region shown in FIG. 5B is covered with a mask layer 86 when the RIE method processing is performed. Therefore, the silicon nitride film 100 is not formed in the mark region.

Next, as shown in FIG. 6A and FIG. 6B, in the memory cell region, the mask pattern feature 82AA sandwiched by the silicon nitride film 100 is removed by wet etching. Thereby, in the memory cell region, a pattern of the silicon nitride film 100 having a pitch smaller than the pitch of the mask pattern feature 82AA in the Y-direction is formed. The mask pattern features formed of the silicon nitride film 100 extend in the X-direction and are arranged in the Y-direction, on the mask layer 80A.

After that, as shown in FIG. 6C and FIG. 6D, the mask layer 86 is removed in the mark region. In the mark region, the mask pattern feature 82BB to which the alignment mark m1 has been transferred is formed on the mask layer 80B.

Next, in the memory cell region, portions of the silicon nitride film 100 formed in a loop shape are removed to form a silicon nitride film 100 extending linearly in the X-direction. To this end, photolithography is performed. The alignment between the mask used at this time (occasionally referred to as a loop cut mask) and the underlayer pattern (the silicon nitride film 100) is made using the mark m1.

As shown in FIG. 7C and FIG. 7D, in the mark region, a mask layer 88B that covers the mask pattern feature 82BB is formed by photolithography and anisotropic etching. In the mask layer 88B, mark pattern features m2 (hereinafter, simply marks m2) that correspond to the positions of the marks m1 and are different from the marks m1 have been formed. The mark m2 is formed on the inside of the position of the mark m1, for example. The mask pattern feature 82BB is opened from the mask layer 88B via the mark m2.

As shown in FIG. 7A and FIG. 7B, in the memory cell region, a mask layer 88A that covers the plurality of silicon nitride films 100 is formed by photolithography and anisotropic etching. Here, the mask layer 88A has openings 88h that expose parts of the silicon nitride films 100. The opening 88h exposes a loop portion rp connecting adjacent silicon nitride films 100, for example. Whether the opening 88h is located in the correct position or not can be assessed by measuring the positions of the mark m1 and the mark m2 by planar SEM or the like. When it has been concluded that the opening 88h is in the correct position, the following process is performed.

Figure 8B:
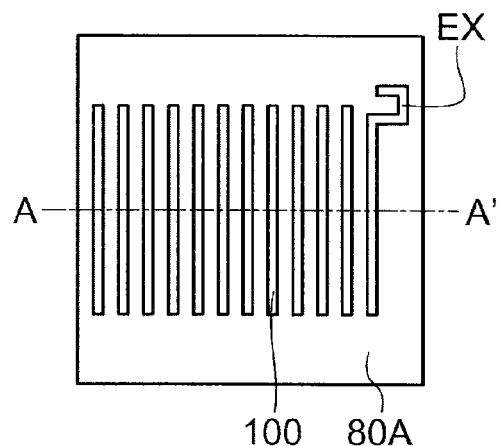

Next, as shown in FIG. 8A and FIG. 8B, in the memory cell region, the silicon nitride films 100 exposed from the opening 88h are removed. For example, the loop portion rp of the silicon nitride film 100 opened from the mask layer 88A is removed by the RIE method.

Figure 8C:
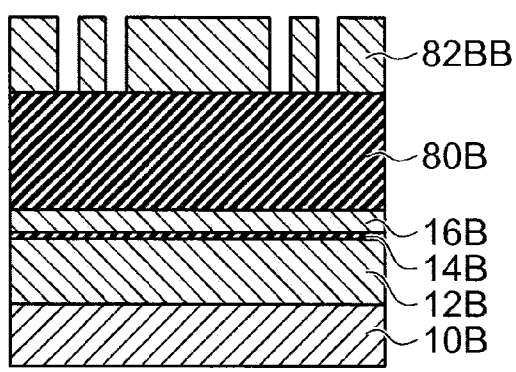
Figure 8C:
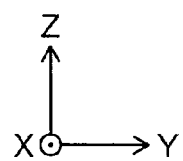
Figure 8D:
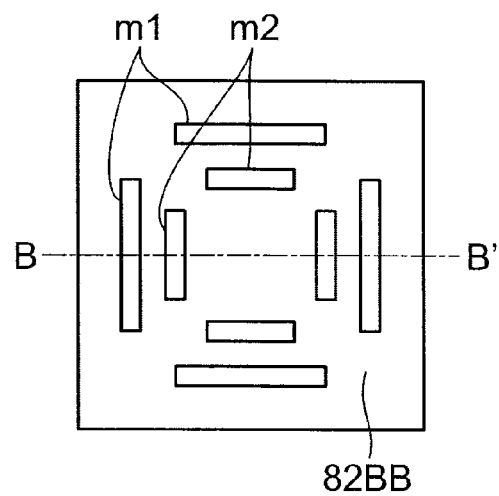
Figure 8D:
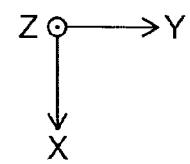

As shown in FIG. 8C and FIG. 8D, in the mark region, the mask pattern feature 82BB opened from the mask layer 88B is removed by the RIE method. By the RIE method, the mark m2 described above, in addition to the mark m1, is transferred to the mask pattern feature 82BB.

Next, as shown in FIG. 9A and FIG. 9B, in the memory cell region, a mask layer 90A that covers the extending portion EX of the silicon nitride film 100 is formed by photolithography and anisotropic etching. The position of the mask layer 90A is determined by the mark m2 formed in the mark region.

As shown in FIG. 9C and FIG. 9D, in the mark region, a mask layer 90B that covers the mask pattern feature 82BB is formed. The mask layers 90A and 90B may be formed simultaneously. The mask layer 90B may be formed in part of the memory cell region.

Next, as shown in FIG. 10A and FIG. 10B, in the memory cell region, the silicon nitride films 100 are used as a mask to perform anisotropic etching to remove the mask layer 80A exposed from the silicon nitride films 100. After the anisotropic etching, the region covered with the mask layer 90A is not etched but left.

As shown in FIG. 10C and FIG. 10D, in the memory cell region, the mask layer 80B is covered with the mask layer 90B and is therefore not removed.

After that, the mask layers 90A and 90B are removed.

Next, as shown in FIG. 11A and FIG. 11B, the silicon nitride films 100 are removed in the memory cell region. Thereby, mask layers 80A extending in the X-direction and arranged in the Y-direction are formed on the metal-containing layer 16A. In the extending portion EX, the silicon nitride film 100 is removed and an extending portion EX of the same material as the mask layer 80A is left.

As shown in FIG. 11C and FIG. 11D, in the mark region, the mask pattern feature 82BB to which the marks m1 and m2 have been transferred is removed. Thereby, the marks m1 and m2 disappear. The mask layer 80B on the lower side of the mask pattern feature 82BB is left.

Next, as shown in FIG. 12A and FIG. 12B, in the memory cell region, the mask layer 80A is used as a mask to perform anisotropic etching (e.g. the RIE method) to remove the metal-containing layer 16A, the resistance change film 14A formed under the metal-containing layer 16A, the silicon-containing layer 12A formed under the resistance change film 14A, and the metal-containing layer 10A formed under the silicon-containing layer 12A.

Thereby, in the memory cell region, memory cells 20 including the metal-containing layer 16A, the resistance change film 14A, the silicon-containing layer 12A, and the metal-containing layer 10A are formed. The memory cells 20 are arranged in the Y-direction. The film of the mask layer 80A may become smaller due to the anisotropic etching.

As shown in FIG. 12C and FIG. 12D, in the mark region, the film of the mask layer 80B may become smaller due to the anisotropic etching.

Next, as shown in FIG. 13A and FIG. 13B, in the memory cell region, an element isolation insulating film 50 is formed between adjacent memory cells 20. The element isolation insulating film 50 is formed also on the upper surface of the mask layer 80A. The element isolation insulating film 50 may be referred to as an interlayer insulating film.

As shown in FIG. 13C and FIG. 13D, in the mark region, the element isolation insulating film 50 is formed above the mask layer 80B.

Next, as shown in FIG. 14A and FIG. 14B, in the memory cell region, the element isolation insulating film 50 and the mask layer 80A are removed by the CMP (chemical mechanical polishing) method until the upper surface of the metal-containing layer 16A is exposed.

As shown in FIG. 14C and FIG. 14D, in the mark region, the element isolation insulating film 50 and the mask layer 80B are removed by the CMP method until the upper surface of the metal-containing layer 16B is exposed. The upper surface of the element isolation insulating film 50 is made flat by the CMP method.

After that, in the memory cell region and the mark region, taking the metal-containing layers 16A and 16B as an underlayer, the manufacturing process illustrated in FIG. 2A to FIG. 14D may be performed on the underlayer; thus, another mark can be formed above the marks m1 and m2 eliminated. Consequently, no marks overlap in the Z-direction, and therefore the external shape of the mark can be prevented from becoming indistinct.

Thus, in the first embodiment, since the mark region as viewed from the Z-direction can be utilized again, the mark region can be made small and the number of the nonvolatile memory chip included in the wafer increases.

The portion of the shape of the extending portion EX is used for the contact region P for connection to a contact or the like (see FIG. 1C). That is, the process of eliminating the marks m1 and m2 can be performed simultaneously with the process of forming the contact region. Consequently, the marks m1 and m2 can be eliminated without increasing the number of manufacturing processes. The silicon nitride film 100 may be replaced with an aluminum nitride film, a carbon film, or the like.

Reference Example 1

In the first embodiment, the marks m1 and m2 are eliminated when the manufacturing proceeds from FIG. 10C (FIG. 10D) to FIG. 11C (FIG. 11D). In a reference example 1 illustrated below, an example in which the manufacturing process is advanced without eliminating the marks m1 and m2 is described below.

FIG. 15A to FIG. 16B are schematic views showing the manufacturing process of the mark region of a nonvolatile memory device according to the reference example 1.

Here, the drawings of the numbers including "A" show schematic cross-sectional views of the mark region, and the drawings of the numbers including "B" show schematic plan views of the mark region.

First, similarly to FIG. 8C and FIG. 8D described above, FIG. 15A and FIG. 15B show a state where the mask pattern feature 82BB to which the marks m1 and m2 have been transferred is formed on the mask layer 80B. In Reference Example 1, the mask pattern feature 82BB is not covered with the mask layer 90B.

If in this state the mask layer 80A is processed by anisotropic etching using the silicon nitride film 100 as a mask in the memory cell region like FIG. 10A and FIG. 10B described above, at the same time in the mark region, also the mask layer 80B exposed from the mask pattern feature 82BB is processed by the anisotropic etching. This state is shown in FIG. 16A and FIG. 16B.

As shown in FIG. 16A and FIG. 16B, the mask layer 80B exposed from the mask pattern feature 82BB is removed by the anisotropic etching, and the marks m1 and m2 are transferred to the mask layer 80B.

If subsequently the manufacturing process is advanced, as shown in FIG. 17A and FIG. 17B, in the mark region, the metal-containing layer 16B exposed from the mask layer 80B, the resistance change film 14B formed under the metal-containing layer 16B, the silicon-containing layer 12B formed under the resistance change film 14B, and the metal-containing layer 10B formed under the silicon-containing layer 12B are removed by anisotropic etching. In other words, in the reference example 1, the marks m1 and m2 are transferred to layers on the lower side of the metal-containing layer 16B.

In contrast, in the first embodiment, the manufacturing process of eliminating the marks m1 and m2 is disappeared as shown in FIG. 11C and FIG. 11D. Therefore, the marks of the layers do not overlap as viewed from above, and the external shape of the mark is distinct in each photolithography process. In other words, the alignment of a mask in each photolithography process can be made with good accuracy. Furthermore, an increase in the area of the nonvolatile memory device caused by mark arrangement does not occur.

Reference Example 2

In a reference example 2 illustrated below, a manufacturing process is described in which, in the mark region, after the mask pattern feature 82BB is removed, the mask layer 80B on the lower side of the mask pattern feature 82BB is removed.

FIG. 18A to FIG. 23B are schematic views showing the manufacturing process of the mark region of a nonvolatile memory device according to the reference example 2.

Here, the drawings of the numbers including "A" show schematic cross-sectional views of the mark region, and the drawings of the numbers including "B" show schematic plan views of the mark region.

First, similarly to FIG. 8C and FIG. 8D described above, FIG. 18A and FIG. 18B show a state where the mask pattern feature 82BB to which the marks m1 and m2 have been transferred is formed on the mask layer 80B.

Here, a mask layer 92 that opens the marks m1 and m2 is formed on the mask pattern feature 82BB.

Figures 19A, 19B:
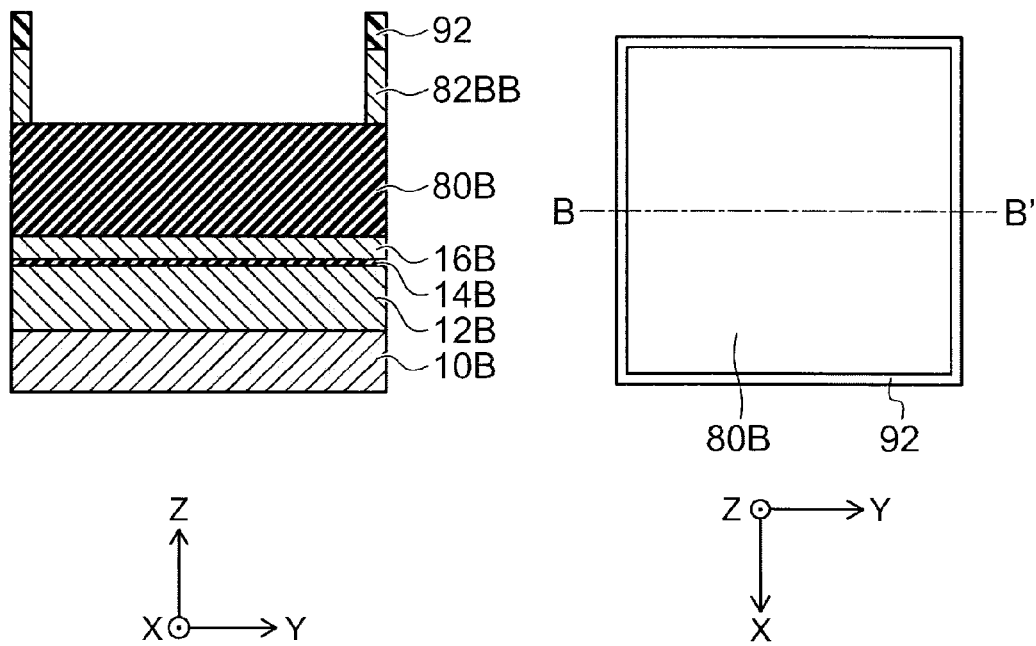

Next, as shown in FIG. 19A to FIG. 19B, the mask pattern feature 82BB exposed from the mask layer 92 is removed by the RIE method. Consequently, the marks m1 and m2 disappear.

Figures 20A, 20B:
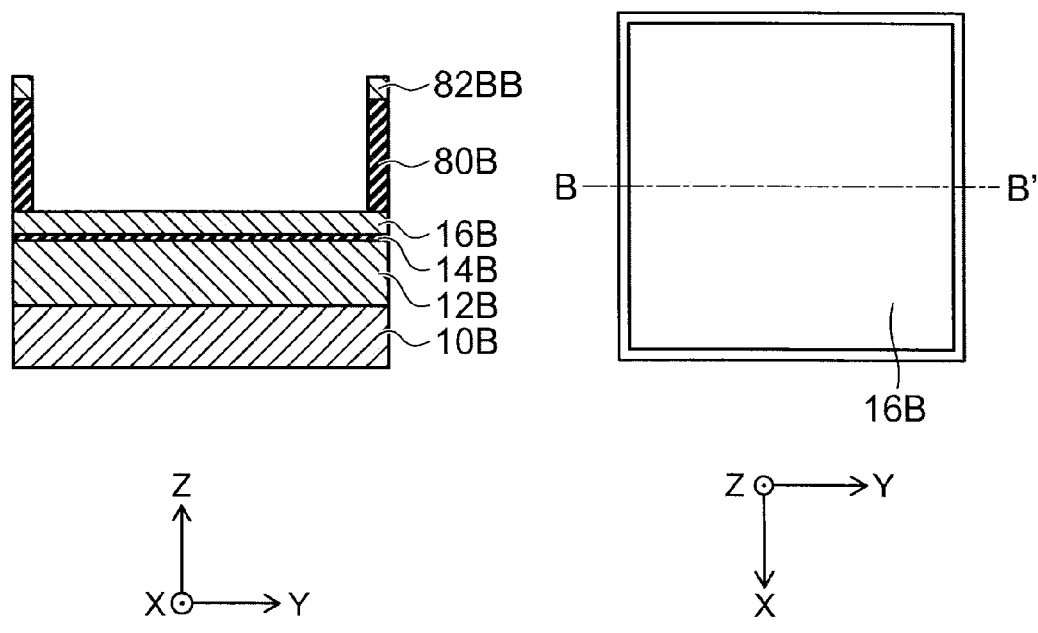

Next, as shown in FIG. 20A to FIG. 20B, the mask pattern feature 82BB is used as a mask to remove the mask layer 80B by the RIE method.

If in this state the layer under the metal-containing layer 16A is continued to be processed in the memory cell region like FIGS. 12A and 12B described above, in the mark region, as shown in FIG. 21A to FIG. 21B, the metal-containing layer 16B exposed from the mask layer 80B, the resistance change film 14B formed under the metal-containing layer 16B, the silicon-containing layer 12B formed under the resistance change film 14B, and the metal-containing layer 10B formed under the silicon-containing layer 12B are removed by anisotropic etching. In other words, a trench tr is formed below the metal-containing layer 16B.

Next, as shown in FIG. 22A to FIG. 22B, the element isolation insulating film 50 is formed in the trench tr. Subsequently, processing by the CMP method is performed on the surface of the element isolation insulating film 50. However, the trench tr has a width wider than between memory cells 20. Therefore, a recess 50e may be formed on the surface of the element isolation insulating film 50 due to the dishing effect. This state is shown in FIG. 23A to FIG. 23B.

New layers are stacked above the region where the recess 50e is formed. However, the upper surfaces of these layers may not become flat due to the influence of the recess 50e existing on their lower side. That is, when a mark is formed above the recess 50e, the shape of the mark may be warped.

On the other hand, in the embodiment, as shown in FIG. 14C, the trench tr does not exist, and the element isolation insulating film 50, which is an object to be etched in a process by the CMP method, does not exist below the upper and lower surfaces of the metal-containing layer 16B. Therefore, in the process after the CMP method, the upper surface of the metal-containing layer 16B is almost flat. Consequently, the shape of a mark formed on a layer above the metal-containing layer 16B is hardly warped, and the position of a mask pattern can be aligned with good accuracy.

Second Embodiment

FIG. 24A to FIG. 25B are schematic cross-sectional views showing the manufacturing process of a nonvolatile memory device according to a second embodiment.

Figure 24A:
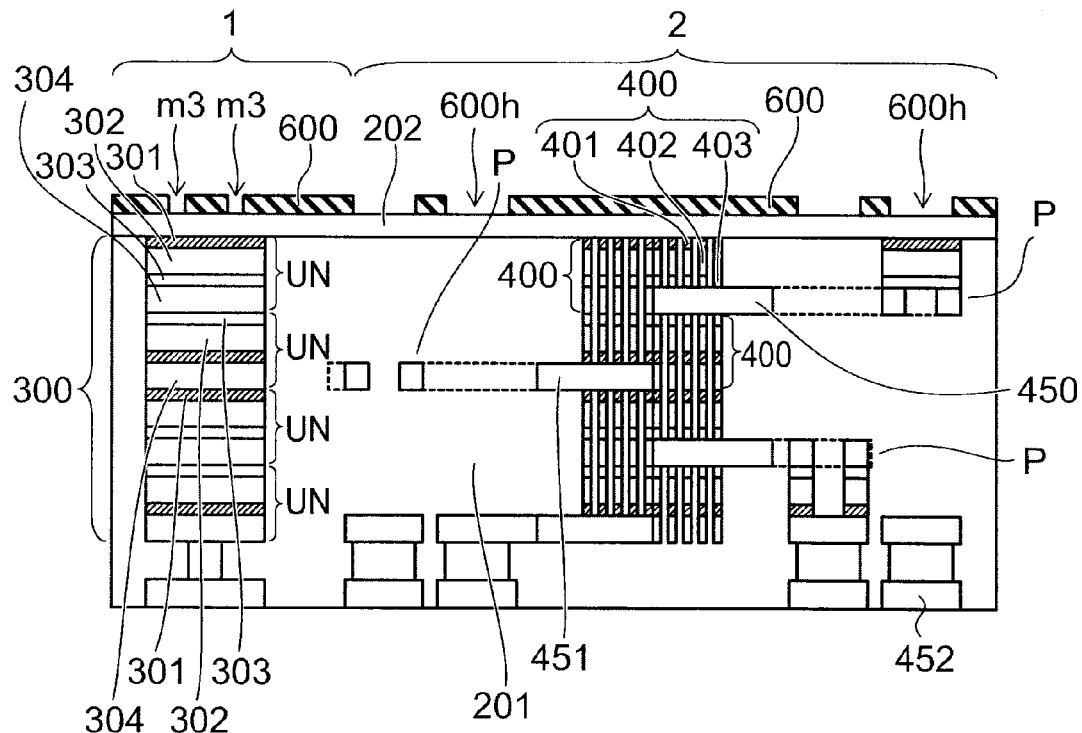
FIG. 24A to FIG. 25B are schematic cross-sectional views showing the manufacturing process of a nonvolatile memory device according to a second embodiment.

As shown in FIG. 24A, in a mark region 1, a stacked body 300 is provided in an insulating layer 201. The stacked body 300 includes periodically repeated structures, and includes a metal-containing layer 301 as the uppermost layer of each structure (each unit). The metal-containing layer 301 contains tungsten (W), for example. The stacked body 300 is a stacked body in which a unit UN including at least a metal-containing layer 304, a select element layer 303, an oxide layer 302, and the metal-containing layer 301 is stacked in plural in the Z-direction. In the example of FIG. 24A, four units UN are stacked.

In a memory cell region 2, memory cells 400 are arranged three-dimensionally in the X-direction, the Y-direction, and the Z-direction in the insulating layer 201 (see FIG. 1C). The memory cell 400 is a stacked body, and includes at least an electrode layer 401, a resistance change film 402, a select element layer 403, and a bit line 450 or a word line 451, for example. The electrode layer 401, the resistance change film 402, and the select element layer 403 are provided between the bit line 450 and the word line 451. The stack structures and the materials of the layers of the unit UN and the memory cell 400 are the same, for example.

After such a structure is formed, an insulating film 202 is formed above the stacked body 300 and above the memory cells 400. Subsequently, a mask layer 600 is patterned above the insulating film 202 by photolithography and etching. The mask layer 600 is a resist layer, for example.

Mark pattern features m3 (hereinafter, simply marks m3) are formed in the mask layer 600 above the stacked body 300 in the mark region 1 via the insulating film 202. The insulating film 202 is exposed from the mark m3. In the memory cell region 2, the mask layer 600 has openings 600h.

Figure 24B:
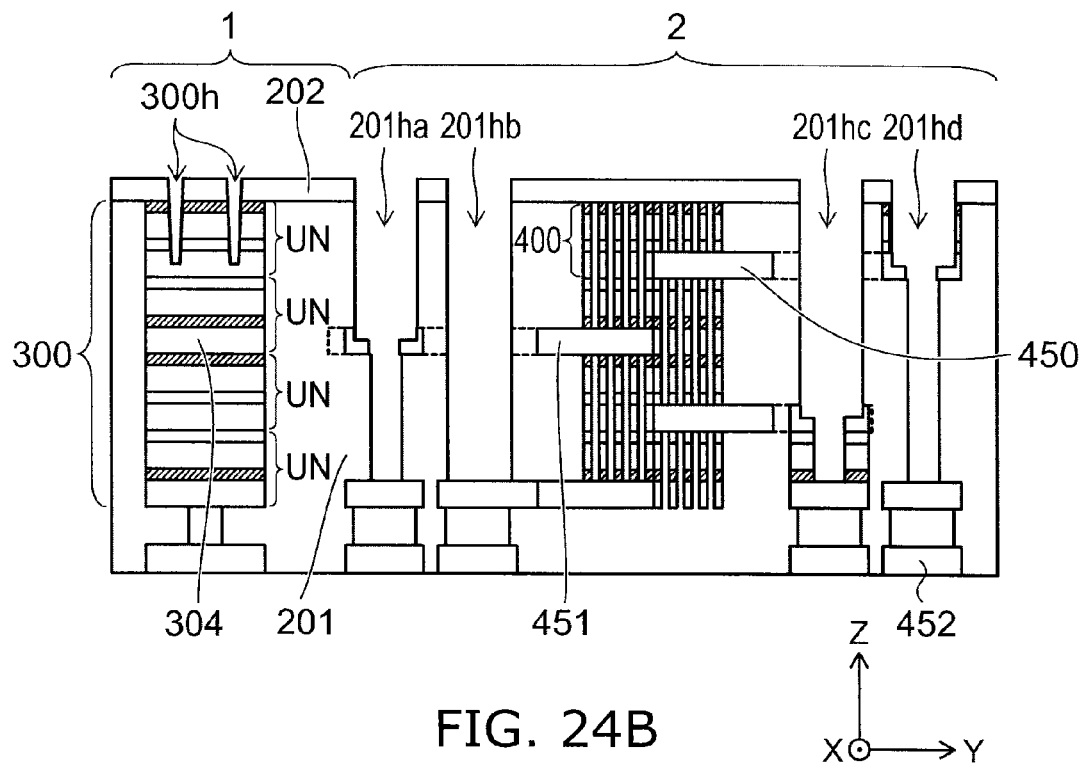

Next, as shown in FIG. 24B, the insulating film 202 exposed from the mark m3 of the mask layer 600 and the stacked body 300 under the mark m3 are etched by the RIE method, for example, and the pattern of the mark m3 is transferred to the insulating film 202 and the stacked body 300. Thereby, holes (openings) 300h are formed in the insulating film 202 and the stacked body 300. The bottom surface of the hole 300h is lower than the upper surface of the metal-containing layer 304 of the uppermost unit UN. The bottom surface of the hole 300h is almost equal to the upper surface of the uppermost bit line 450 exposed by a contact hole 201hd.

Etching processing is performed simultaneously also in the memory cell region 2 to etch the insulating film 202 exposed from the opening 600h of the mask layer 600 and the insulating layer 201 under the opening 600h. Thereby, in the memory cell region 2, contact holes 201ha, 201hb, 201hc, and 201hd are formed. The mask layer 600 is removed after the etching processing.

After that, a lithography process may be performed. This process is performed in the case of forming a cover mask for implanting ions into proper positions, the case of forming a mask for forming another pattern, or the like, for example.

Figure 25A:
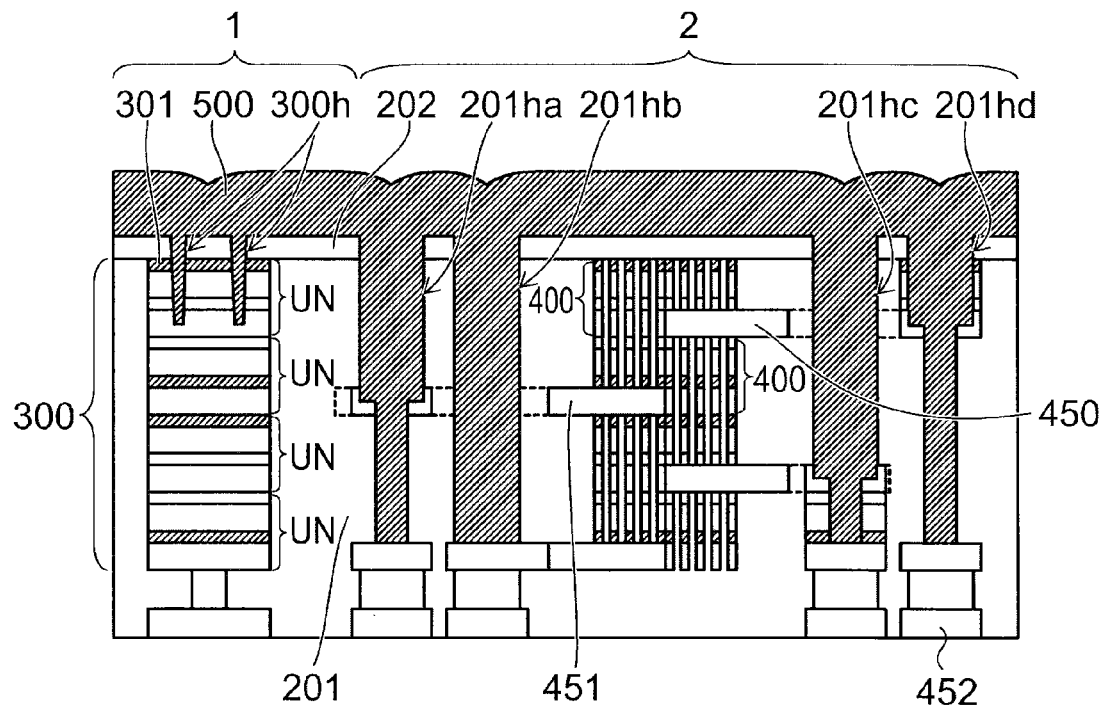

Next, as shown in FIG. 25A, in the mark region 1, a metal-containing layer 500 containing the same material as the uppermost metal-containing layer 301 of the stacked body 300 is formed in the hole 300h, and the metal-containing layer 500 is formed also on the insulating film 202. In the memory cell region 2, the metal-containing layer 500 is formed in each of the contact holes 201ha, 201hb, 201hc, and 201hd, and the metal-containing layer 500 is formed also on the insulating film 202. The metal-containing layer 500 is formed by the CVD method, for example.

Figure 25B:
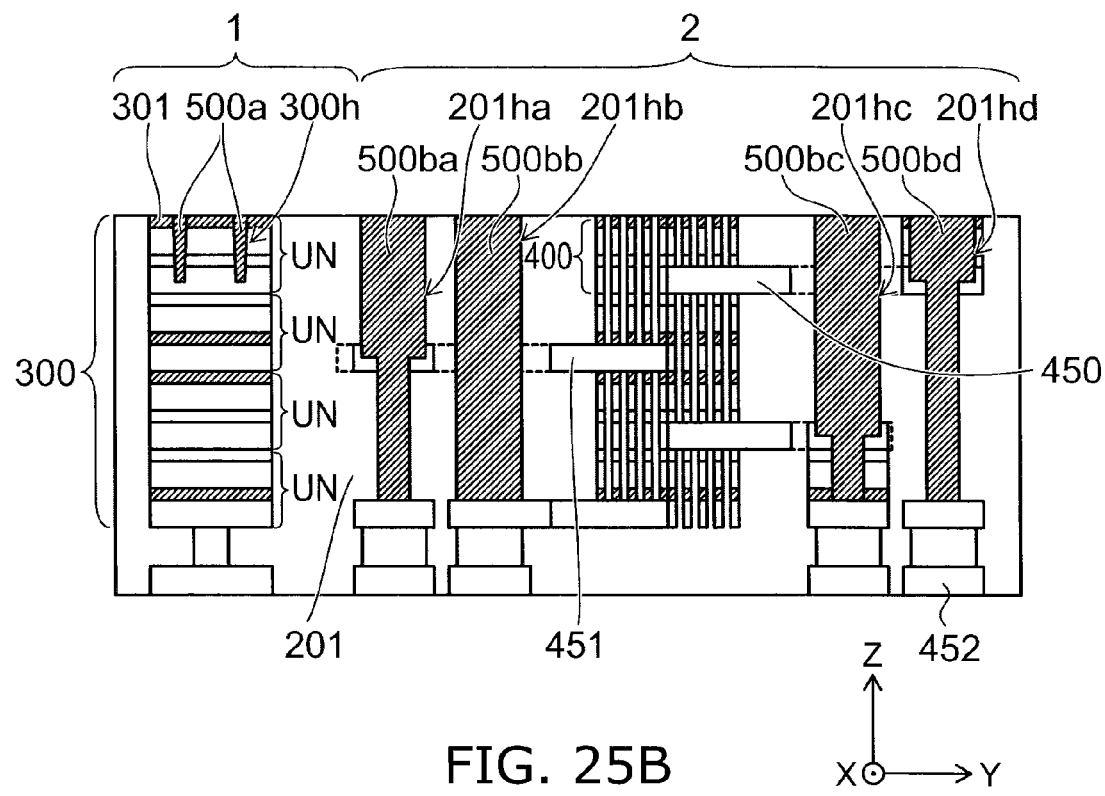

Next, as shown in FIG. 25B, the metal-containing layer 500 formed on the insulating film 202 and the insulating film 202 are removed by the CMP method. For example, using the uppermost metal-containing layer 301 of the stacked body 300 and the uppermost electrode layer 401 of the memory cell 400 as a stopper film for the CMP method, the metal-containing layer 500 and the insulating film 202 are removed by the CMP method up to on the uppermost metal-containing layer 301 of the stacked body 300 and up to on the uppermost electrode layer 401 of the memory cell 400. Consequently, contacts that electrically connect the bit lines 450 and the word lines 451 and an interconnection layer 452 lying below them are formed.

Thereby, in the mark region 1, the metal-containing layer 301 and a metal-containing layer 500a are exposed from the insulating film 202. By the CMP method, the upper surface of the metal-containing layer 500a formed in the hole 300h and the upper surface of the metal-containing layer 301 become flush.

In the memory cell region 2, the electrode layer 401 is exposed, and a metal-containing layer 500ba, a metal-containing layer 500bb, a metal-containing layer 500bc, and a metal-containing layer 500bd separated from the metal-containing layer 500 by the CMP method are formed in the contact holes 201ha, 201hb, 201hc, and 201hd, respectively.

Figure 26A:
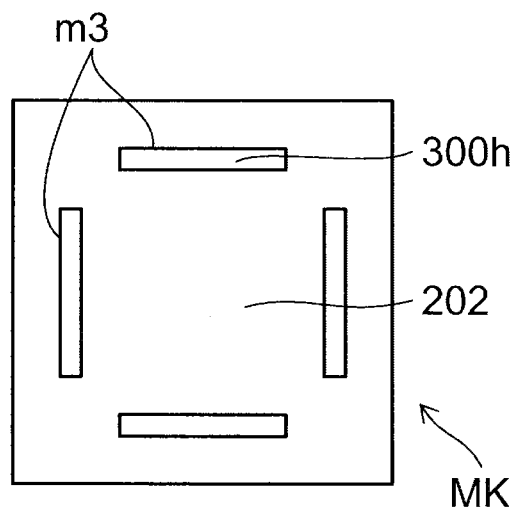
FIG. 26A and FIG. 26B are schematic plan views showing the manufacturing process of the nonvolatile memory device according to the second embodiment.
Figure 26B:
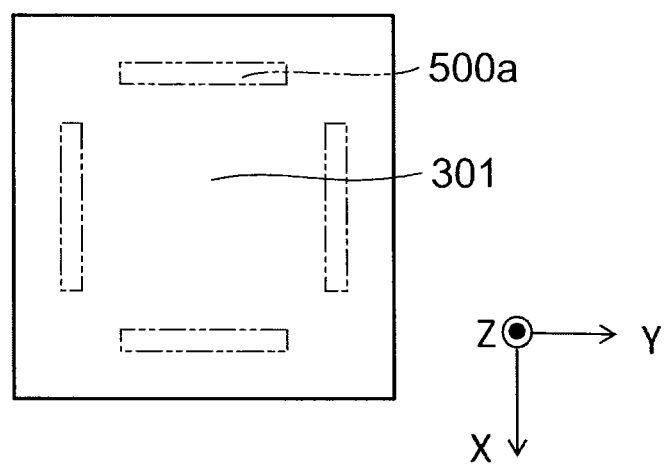

FIG. 26A and FIG. 26B are schematic plan views showing the manufacturing process of the nonvolatile memory device according to the second embodiment.

FIG. 26A shows a plan view of the mark region 1 in FIG. 24B as viewed from the Z-direction, and FIG. 26B shows a plan view of the mark region 1 in FIG. 25B as viewed from the Z-direction.

In the stage shown in FIG. 24B, since a relatively deep hole 300h is formed, the contrast between the upper surface of the insulating film 202 and the mark m3 is clear. Consequently, the hole 300h can be used as an alignment mark to a cover mask of ion implantation or the like. Furthermore, by observing the width of the hole 300h, the hole 300h can be used as a mark for checking the conditions of processing. The mark portion MK has four marks m3, for example.

However, in the stage shown in FIG. 25B, since the material is the same between the pattern of the metal-containing layer 301 and the metal-containing layer 500a, the metal-containing layer 301 and the metal-containing layer 500a provide little contrast, and cannot be observed as a mark pattern. In other words, the pattern of the hole 300h transferred to the stacked body 300 becomes obscure.

Also in the second embodiment, another mark can be formed above the hole 300h that has become obscure. Thus, in the second embodiment, since the place where marks are arranged can be utilized again, the shrinking of dicing area of a wafer is enabled. Therefore, the number of the nonvolatile memory chip included in the wafer increases.

Third Embodiment

FIG. 27A to FIG. 29B are schematic cross-sectional views showing the manufacturing process of a nonvolatile memory device according to a third embodiment.

Figure 27A:
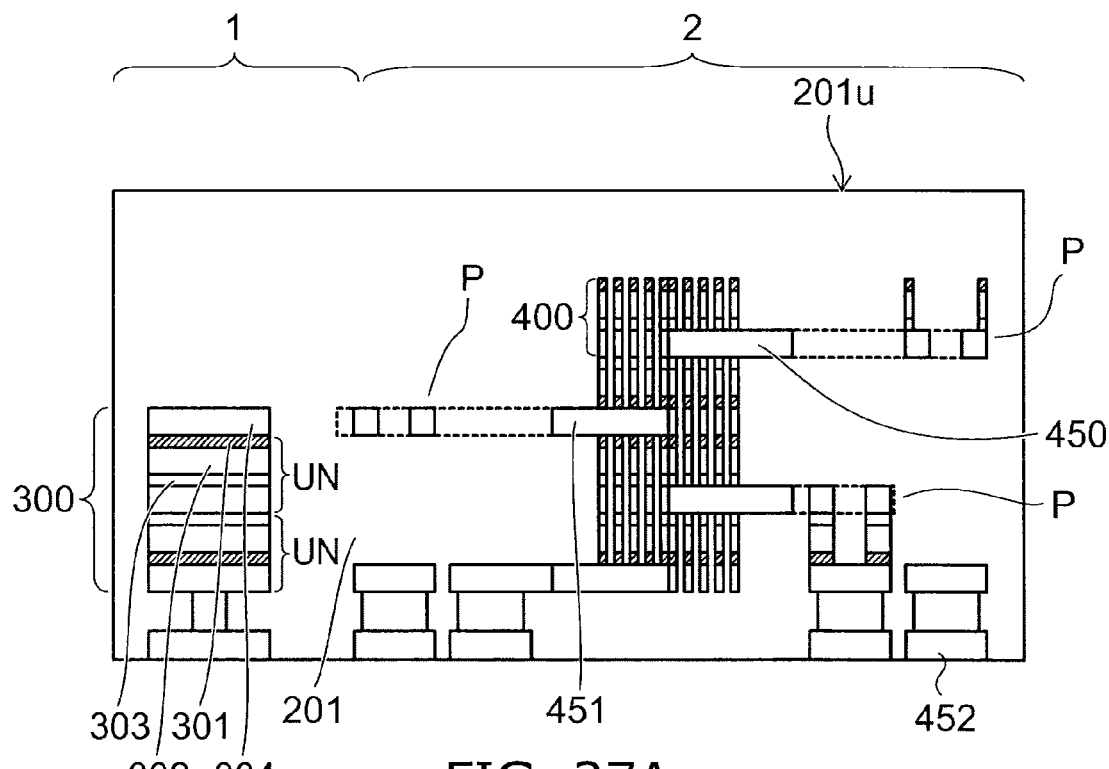
FIG. 27A to FIG. 29B are schematic cross-sectional views showing the manufacturing process of a nonvolatile memory device according to a third embodiment.

FIG. 27A shows a state before processing by the CMP method is performed on the upper surface 201u of the insulating layer 201.

In the example of FIG. 27A, two units UN are stacked in the mark region 1. On the other hand, in the memory cell region 2, the memory cell 400 corresponding to the unit UN is stacked in four layers. Thus, the height of the upper surface of the stacked body 300 in the mark region 1 is lower than the height of the upper surface of the stacked body in the memory cell region 2.

That is, as shown in FIG. 27A, in the third embodiment, the height of the stacked body 300 provided in the mark region 1 is lower than the height of the stacked body 300 in the second embodiment. Accordingly, the thickness of the insulating layer 201 formed above the stacked body 300 is thicker than the thickness of the insulating layer 201 formed above the plurality of memory cells 400.

If in such a state processing by the CMP method is performed on the upper surface 201*u* of the insulating layer 201, the insulating layer 201 above the stacked body 300 formed with a larger film thickness is ground deeper than the insulating layer 201 formed above the memory cells 400 due to the dishing effect.

Figure 27B:
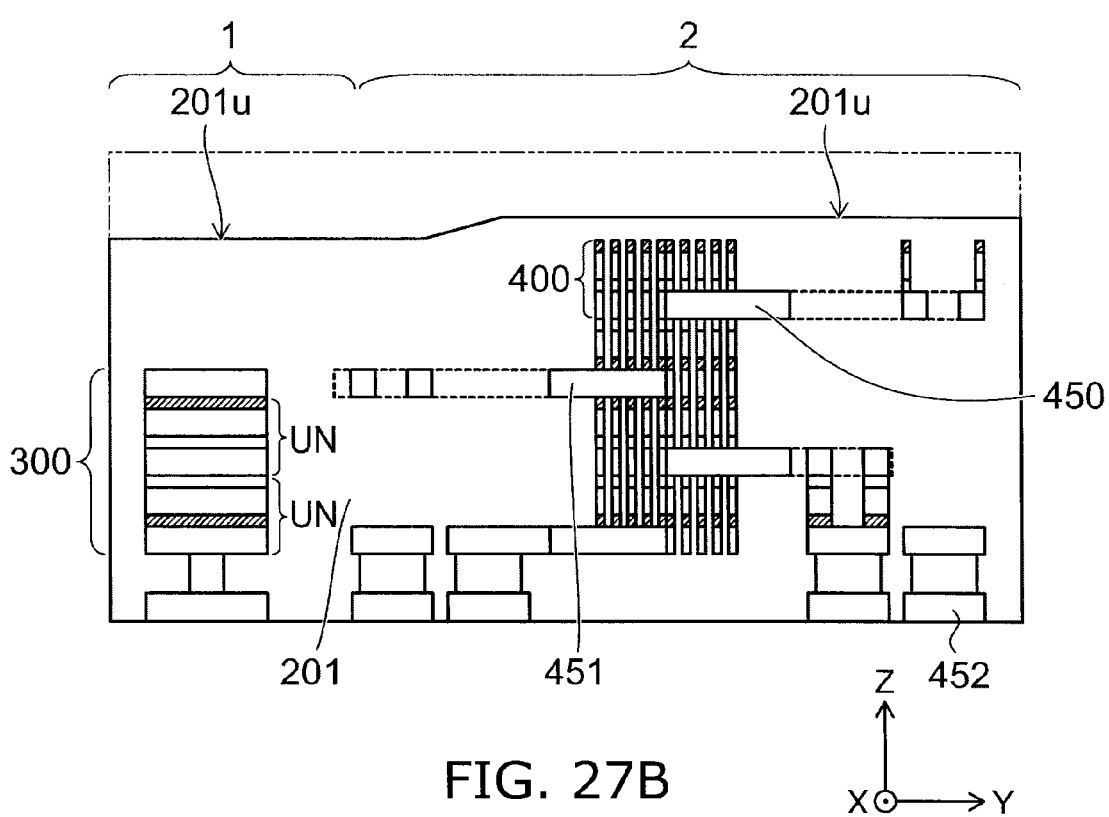

Therefore, after the CMP method, as shown in FIG. 27B, a difference is provided in the height of the upper surface of the insulating layer 201 between the portion covering the stacked body 300 and the portion covering the plurality of memory cells 400. For example, the height of the portion of the insulating layer 201 covering the stacked body 300 is lower than the height of the uppermost memory cell 400.

Figure 28A:
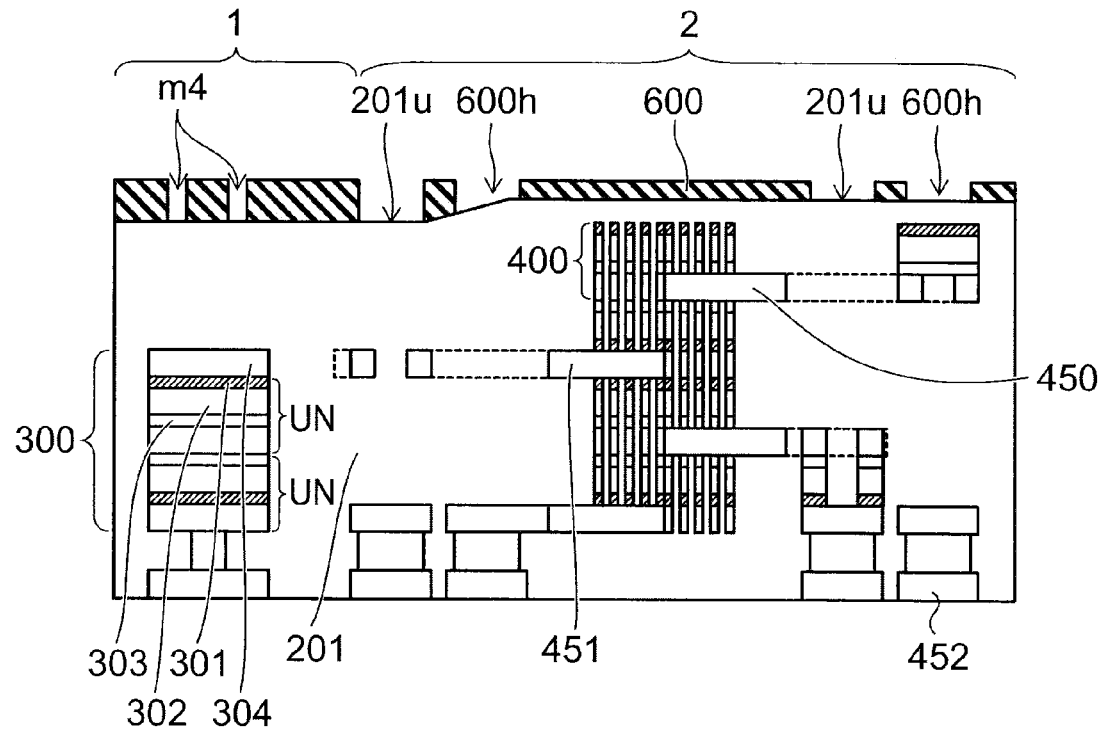

Next, as shown in FIG. 28A, the mask layer 600 is patterned above the insulating layer 201 by photolithography and etching. The mask layer 600 is a resist layer, for example. Mark pattern features m4 (hereinafter, simply marks m4) are formed in the mask layer 600 above the stacked body 300 in the mark region 1 via the insulating layer 201. The mark m4 has an opening, and the insulating layer 201 is exposed from the mark m4 via the opening. In the memory cell region 2, the mask layer 600 has a plurality of openings 600*h*.

Figure 28B:
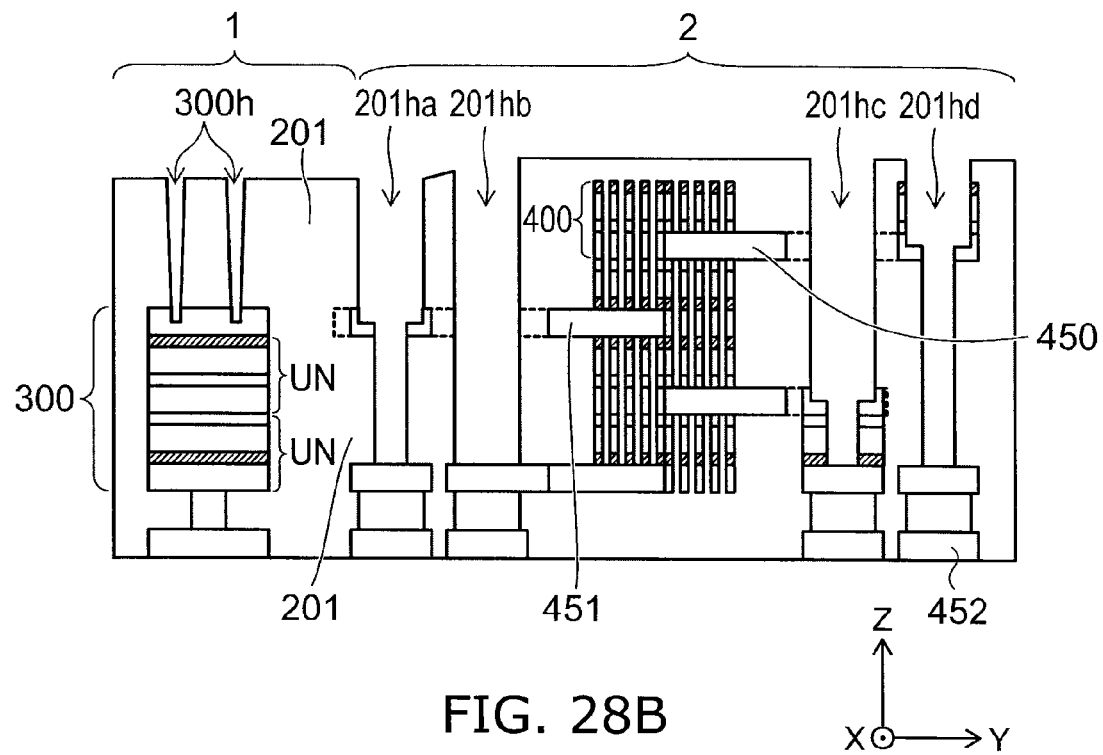

Next, as shown in FIG. 28B, the insulating layer 201 exposed from the mark m4 of the mask layer 600 and the stacked body 300 under the mark m4 are etched by the RIE method, for example, and the pattern of the mark m4 is transferred to the insulating layer 201 and the stacked body 300. Thereby, holes 300*h* are formed in the insulating layer 201 and the stacked body 300. The bottom surface of the hole 300*h* is lower than the upper surface of the uppermost unit NU. The bottom surface of the hole 300*h* is almost equal to the upper surface of the uppermost word line 451 exposed by a contact hole 201*ha*.

Etching processing is performed simultaneously also in the memory cell region 2 to etch the insulating layer 201 exposed from the opening 600*h* of the mask layer 600. Thereby, in the memory cell region 2, contact holes 201*ha*, 201*hb*, 201*hc*, and 201*hd* are formed. The mask layer 600 is removed after the etching processing.

After that, a lithography process may be performed. This process is performed in the case of forming a cover mask for implanting ions into proper positions, the case of forming a mask for forming another pattern, or the like, for example.

Figure 29A:
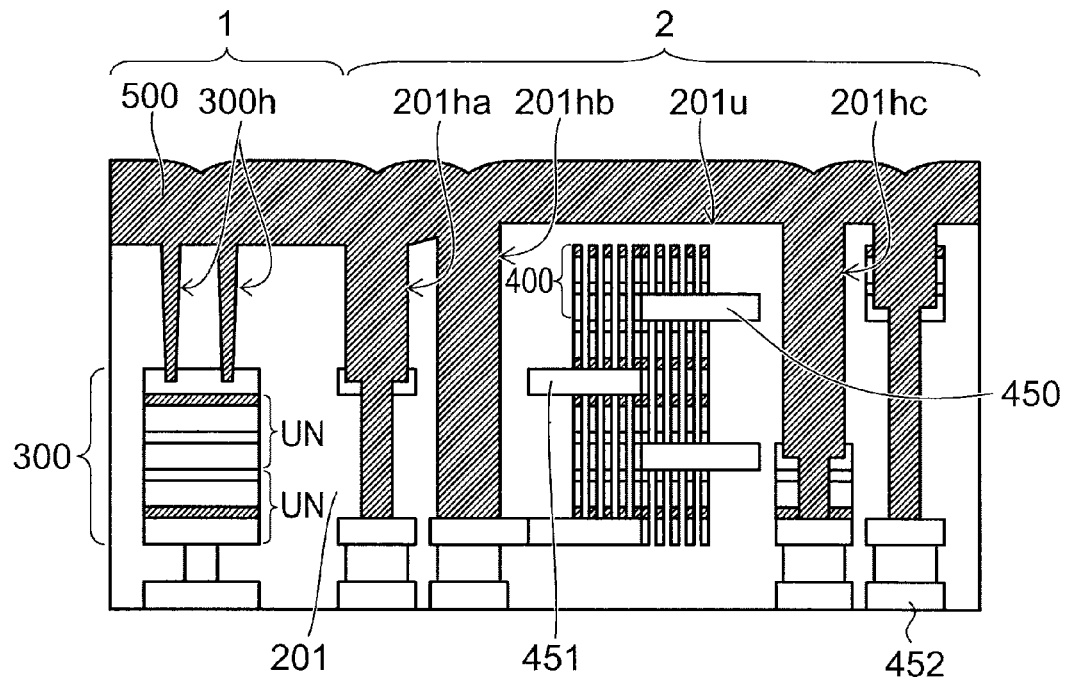

Next, as shown in FIG. 29A, in the mark region 1, the metal-containing layer 500 is formed in the hole 300*h*, and the metal-containing layer 500 is formed also on the upper surface 201*u* of the insulating layer 201. In the memory cell region 2, the metal-containing layer 500 is formed in each of the contact holes 201*ha*, 201*hb*, 201*hc*, and 201*hd*, and the metal-containing layer 500 is formed on the upper surface 201*u* of the insulating layer 201.

Figure 29B:
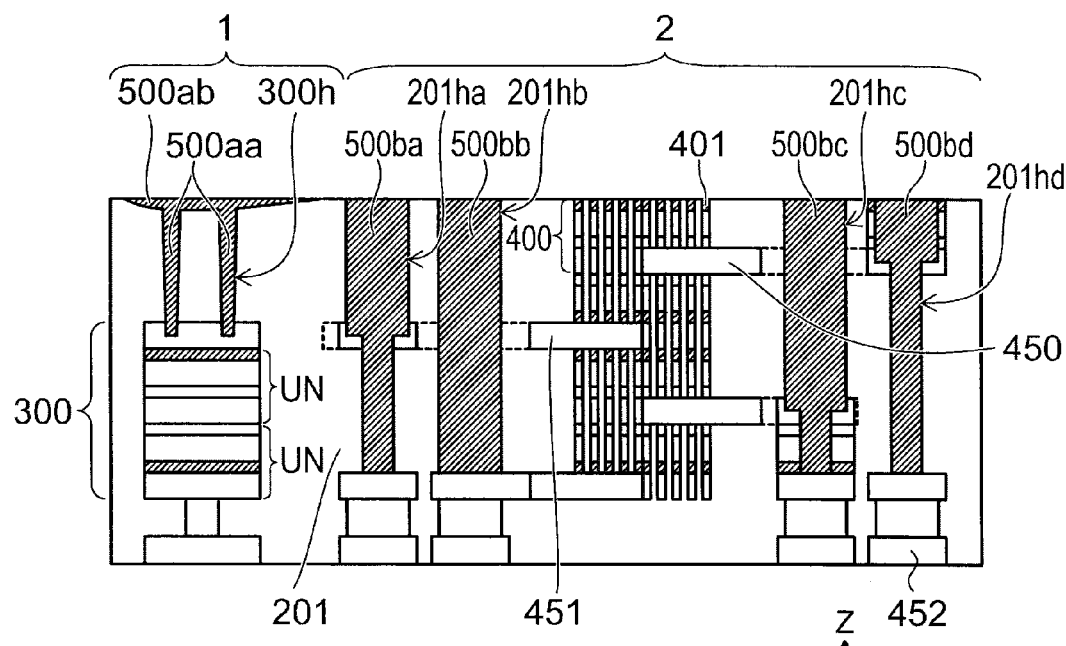

Next, as shown in FIG. 29B, the metal-containing layer 500 and part of the insulating layer 201 under the metal-containing layer 500 are removed by the CMP method.

For example, in the memory cell region 2, the uppermost electrode layer 401 of the memory cell 400 is used as a stopper film to remove the metal-containing layer 500 and the insulating layer 201 above the memory cell 400. Here, the upper surface 201*u* of the insulating layer 201 in the mark region 1 is lower than the uppermost electrode layer 401 of the memory cell 400. Therefore, in the mark region 1, a metal-containing layer 500*aa* separated from the metal-containing layer 500 is formed in the hole 300*h*, and a metal-containing layer 500*ab* remains on the upper surface of the mark portion MK. That is, by the metal-containing layer 500*ab* remaining on the upper surface of the insulating layer 201 in the mark region 1, which surface has become lower than that in the memory cell region 2, the upper surface of the mark portion MK is covered with the metal-containing layer 500*ab*.

In the memory cell region 2, a metal-containing layer 500*ba*, a metal-containing layer 500*bb*, a metal-containing layer 500*bc*, and a metal-containing layer 500*bd* are formed in the contact holes 201*ha*, 201*hb*, 201*hc*, and 201*hd*, respectively. Consequently, contacts that electrically connect the bit lines 450 and the word lines 451 and the interconnection layer 452 lying below them are formed.

Figure 30A:
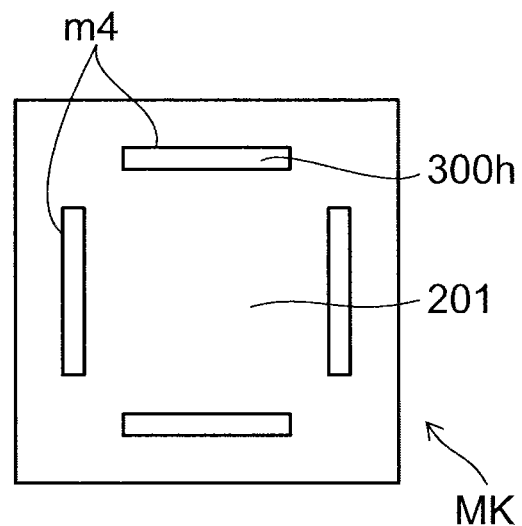
FIG. 30A and FIG. 30B are schematic plan views showing the manufacturing process of the nonvolatile memory device according to the third embodiment.
Figure 30B:
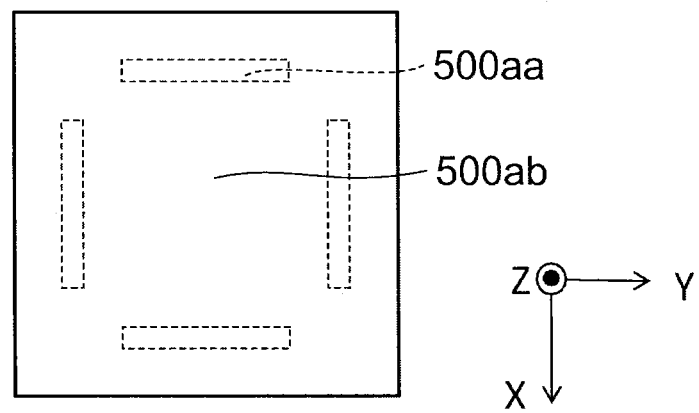

FIG. 30A and FIG. 30B are schematic plan views showing the manufacturing process of the nonvolatile memory device according to the third embodiment.

FIG. 30A shows a plan view of the mark region 1 in FIG. 28B as viewed from the Z-direction, and FIG. 30B shows a plan view of the mark region 1 in FIG. 29B as viewed from the Z-direction.

In the stage shown in FIG. 28B, since a relatively deep hole 300*h* is formed, the contrast between the upper surface of the insulating layer 201 and the mark m4 is clear. Consequently, the hole 300*h* can be used as an alignment mark to a cover mask of ion implantation or the like. Furthermore, by observing the width of the hole 300*h*, the hole 300*h* can be used as a mark for checking the conditions of processing. Here, the mark portion MK has four marks m4, for example.

On the other hand, in the stage shown in FIG. 29B, since the mark portion MK is covered with the metal-containing layer 500*ab*, the pattern of the hole 300*h* transferred to the insulating layer 201 has become obscure due to the metal-containing layer 500*ab*.

Therefore, also in the third embodiment, another mark can be formed above the mark portion MK that has become obscure. Thus, in the third embodiment, since the place where marks are arranged can be utilized again, the shrinking of dicing area of a wafer is enabled. So, the number of the nonvolatile memory chip included in the wafer increases.

Fourth Embodiment

FIG. 31A to FIG. 33 and FIG. 37 are schematic cross-sectional views showing the manufacturing process of a nonvolatile memory device according to a fourth embodiment. The fourth embodiment is, unlike the second and third embodiments, an example in which the mark is made more distinguishable, rather than less distinguishable.

Figure 31A:
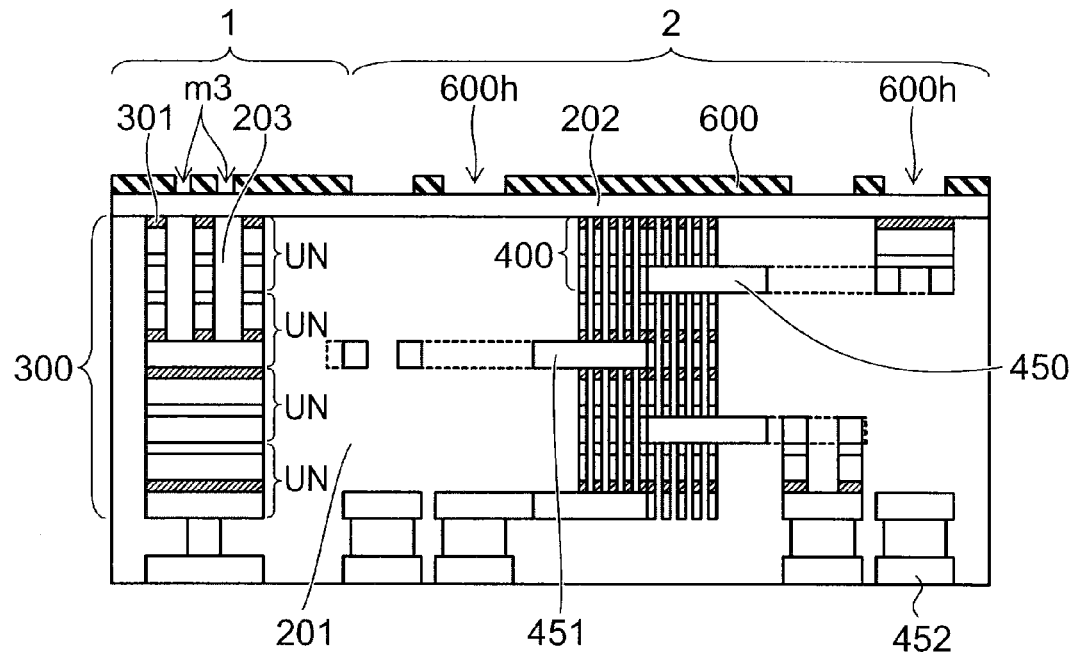
FIG. 31A to FIG. 33 are schematic cross-sectional views showing the manufacturing process of a nonvolatile memory device according to a fourth embodiment.

As shown in FIG. 31A, in the mark region 1, the stacked body 300 is provided in the insulating layer 201. The stacked body 300 includes the metal-containing layer 301 as its uppermost layer. The stacked body 300 has trenches FGh. The bottom surface of the trench FGh is almost equal to the upper surface of the word line 451 located in a bottom portion of the second highest memory cell 400. That is, the trench FGh can be formed simultaneously with processing two layers of memory cells 400. An insulating layers 203 are buried in the trench FGh.

In the memory cell region 2, memory cells 400 are arranged three-dimensionally in the X-direction, the Y-direction, and the Z-direction in the insulating layer 201. In the example of FIG. 31A, four units UN are stacked in the mark region 1, and four units UN are stacked in the memory cell region 2. The bottom surface of the insulating layer 203 is located below the lower surface of the uppermost unit UN.

After such a structure is formed, the insulating film 202 is formed above the stacked body 300, above the insulating layer 203, and above the memory cells 400. Subsequently, the mask layer 600 is patterned on the insulating film 202 by photolithography and etching.

Marks m3 are formed in the mask layer 600 above the insulating layer 203 of the stacked body 300 in the mark region 1. The insulating film 202 is exposed from the mark m3. In the memory cell region 2, the mask layer 600 has openings 600h.

Figure 31B:
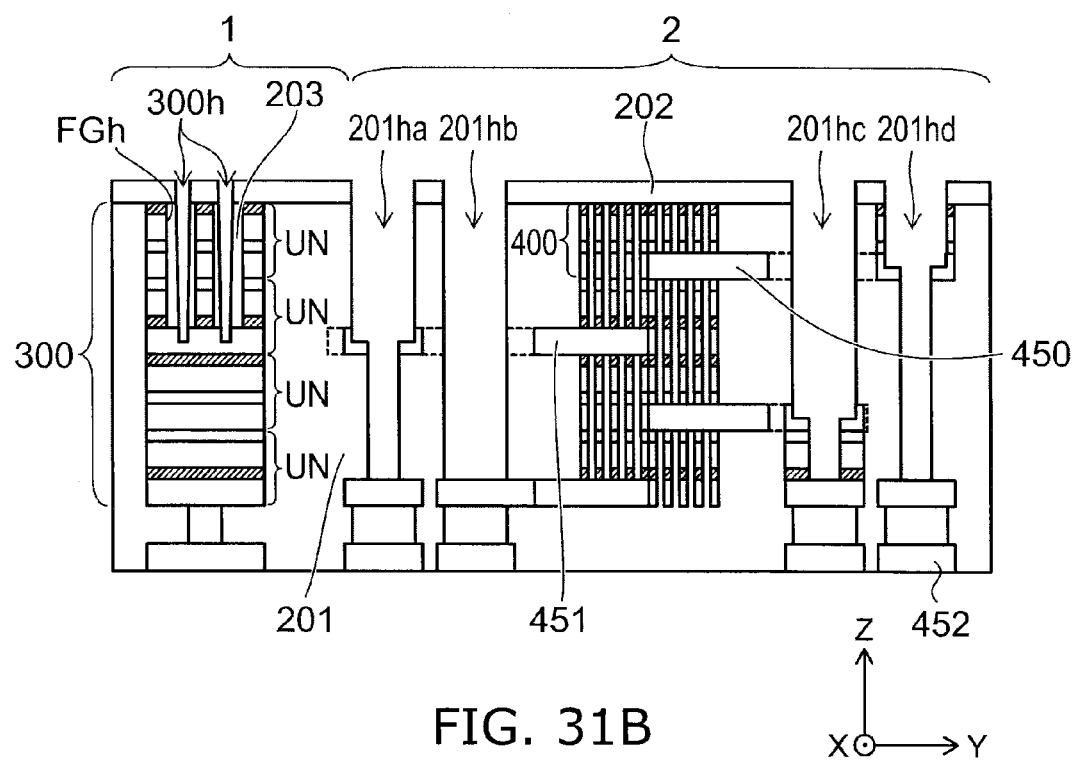

Next, as shown in FIG. 31B, the insulating film 202 exposed from the mark m3 of the mask layer 600, and the insulating layer 203 and the stacked body 300 under the mark m3 are etched by the RIE method, for example, and the pattern of the mark m3 is transferred to the insulating films 202 and 203 and the stacked body 300. Thereby, holes 300h are formed in the insulating films 202 and 203 and the stacked body 300. The bottom surface of the hole 300h is lower than the upper surface of the metal-containing layer 304 of the uppermost unit UN. The bottom surface of the hole 300h is almost equal to the upper surface of the uppermost bit line 450 exposed by a contact hole 201hd.

Etching processing is performed simultaneously also in the memory cell region 2 to etch the insulating film 202 exposed from the opening 600h of the mask layer 600 and the insulating layer 201 under the opening 600h. Thereby, in the memory cell region 2, contact holes 201ha, 201hb, 201hc, and 201hd are formed. The mask layer 600 is removed after the etching processing.

After that, a lithography process may be performed. This process is performed in the case of forming a cover mask for implanting ions into proper positions, the case of forming a mask for forming another pattern, or the like, for example.

Figure 32A:
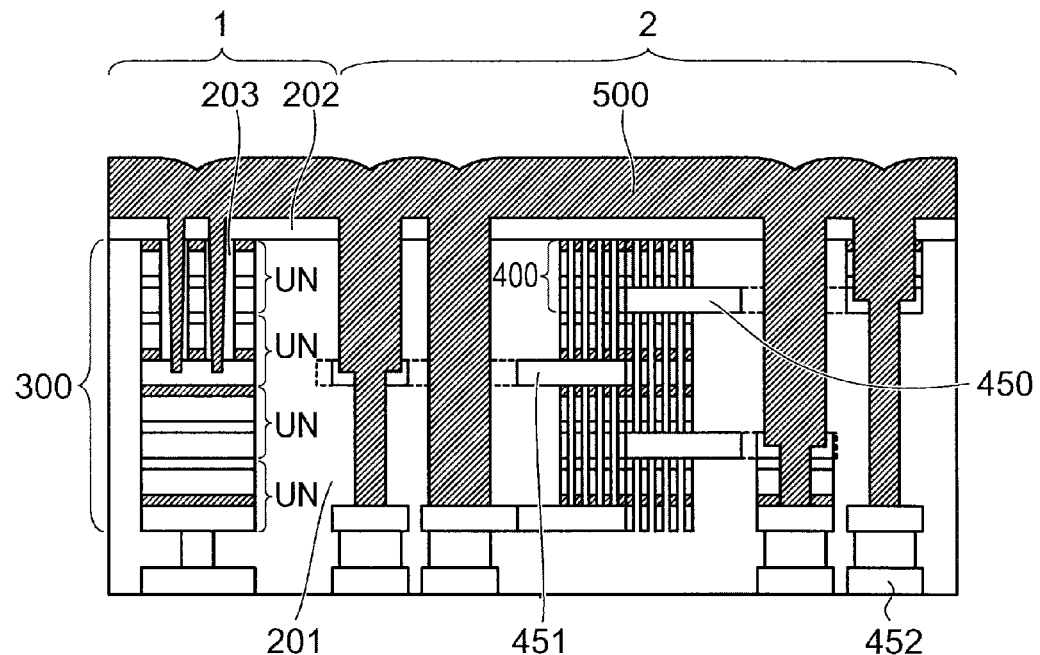

Next, as shown in FIG. 32A, in the mark region 1, the metal-containing layer 500 is formed in the hole 300h, and the metal-containing layer 500 is formed also on the insulating film 202. In the memory cell region 2, the metal-containing layer 500 is formed in each of the contact holes 201ha, 201hb, 201hc, and 201hd, and the metal-containing layer 500 is formed also on the insulating film 202. The metal-containing layer 500 is formed by the CVD method, for example.

Figure 32B:
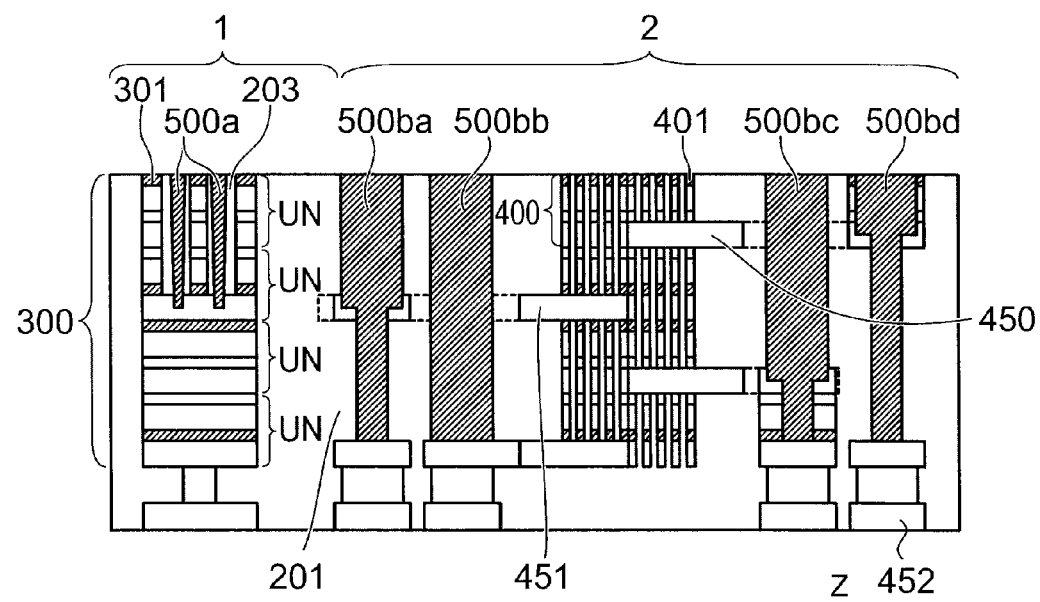

Next, as shown in FIG. 32B, the metal-containing layer 500 formed on the insulating film 202 and the insulating film 202 are removed by the CMP method. For example, using the uppermost metal-containing layer 301 of the stacked body 300 and the uppermost electrode layer 401 of the memory cell 400 as a stopper film for the CMP method, the metal-containing layer 500 and the insulating film 202 are removed by the CMP method up to on the uppermost metal-containing layer 301 of the stacked body 300 and up to on the uppermost electrode layer 401 of the memory cell 400.

Thereby, in the mark region 1, the metal-containing layer 301, a metal-containing layer 500a, and the insulating layer 203 made of a material different from the metal-containing layer 301 and the metal-containing layer 500 are exposed from the insulating film 202. By the CMP method, the upper surface of the metal-containing layer 500a formed in the hole 300h, the upper surface of the insulating layer 203, and the upper surface of the metal-containing layer 301 become almost flush. Consequently, contacts that electrically connect the bit lines 450 and the word lines 451 and the interconnection layer 452 lying below them are formed.

In the memory cell region 2, the electrode layer 401 is exposed, and a metal-containing layer 500ba, a metal-containing layer 500bb, a metal-containing layer 500bc, and a metal-containing layer 500bd separated from the metal-containing layer 500 by the CMP method are formed in the contact holes 201ha, 201hb, 201hc, and 201hd, respectively. Next, as shown in FIG. 33, the surface of the insulating layer 203 is etched back.

When viewed from above at this stage, third portions (marks m3' described later) each of which has a first portion (the metal-containing layer 500a) and a second portion (the insulating layer 203) surrounding the first portion and made of a material different from the first portion are formed. The upper surface of the second portion is lower than the upper surface of the first portion.

FIG. 34A to FIG. 36 are schematic plan views showing the manufacturing process of the nonvolatile memory device according to the fourth embodiment.

Figure 33:
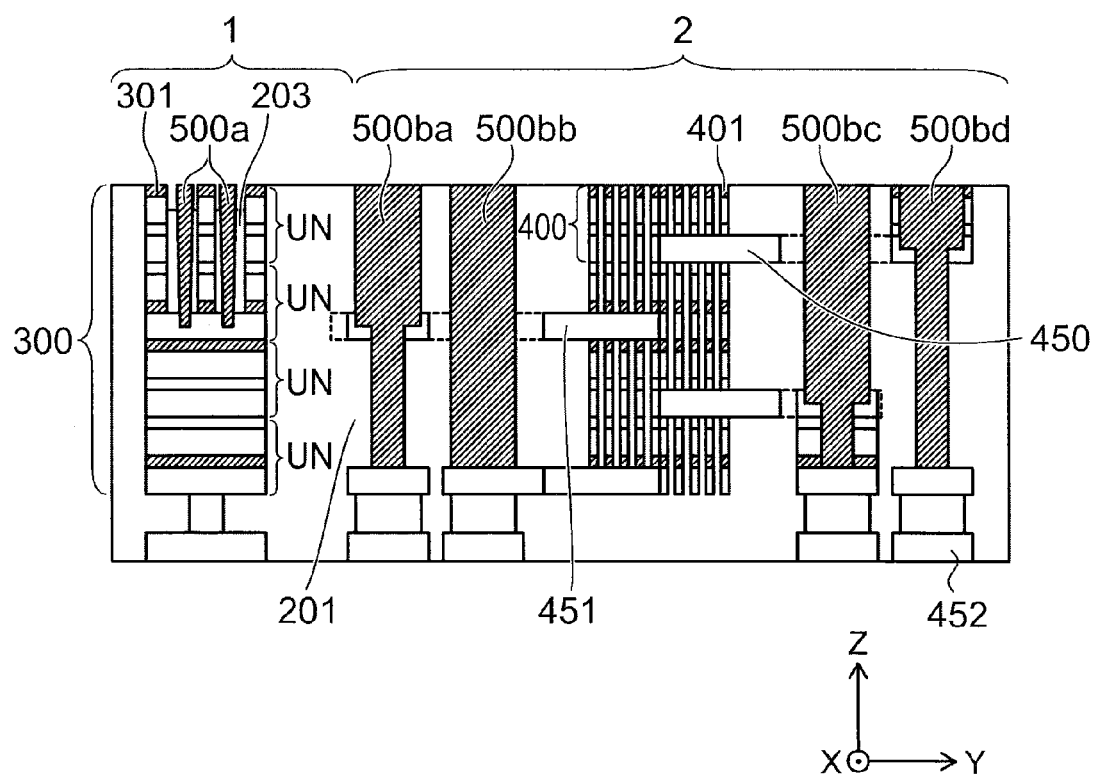
Figure 34A:
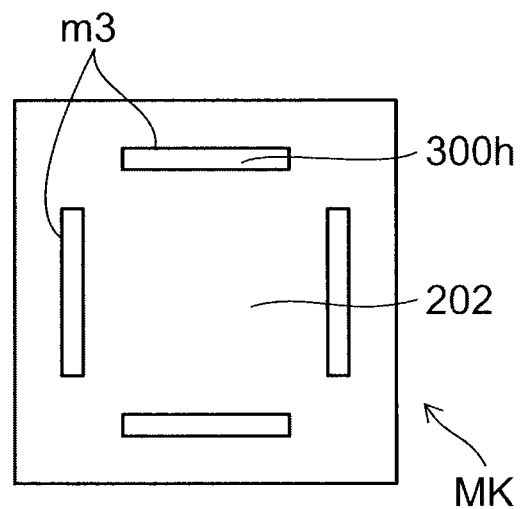
Figure 34B:
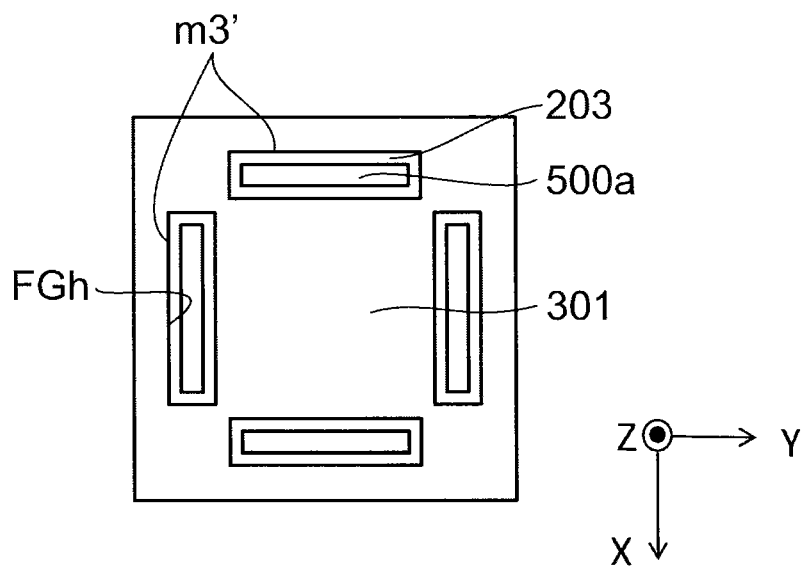

FIG. 34A shows a plan view of the mark region 1 in FIG. 31B as viewed from the Z-direction, and FIG. 34B shows a plan view of the mark region 1 in FIG. 33 as viewed from the Z-direction.

In the stage shown in FIG. 31B, since a relatively deep hole 300h is formed, the contrast between the upper surface of the insulating film 202 and the mark m3 is clear. Consequently, the hole 300h can be used as an alignment mark to a cover mask of ion implantation or the like. Furthermore, by observing the width of the hole 300h, the hole 300h can be used as a mark for checking the conditions of processing. In this stage, the mark portion MK appears clearly. Here, the mark portion MK has four marks m3, for example. Consequently, the mark m3 can be used as an alignment mark in a subsequent lithography process.

Also in the stage shown in FIG. 33 (FIG. 34B), since the material of the insulating layer 203 and the material of the metal-containing layer 500a are different and a level difference has been formed between the insulating layer 203 and the metal-containing layer 500a by the etchback of the insulating layer 203, a contrast is provided by the insulating layer 203 and the metal-containing layer 500a, and a mark m3' to which the mark m3 has been transferred appears more clearly.

Here, as viewed from above, the third portions (the marks m3') are arranged so as to oppose each other across a fourth portion (the metal-containing layer 301), and the heights of the upper surfaces of the first portion (the metal-containing layer 500a) and the fourth portion (the metal-containing layer 301) are equal. The materials of the first portion (the metal-containing layer 500a) and the fourth portion (the metal-containing layer 301) are the same.

Figure 37:
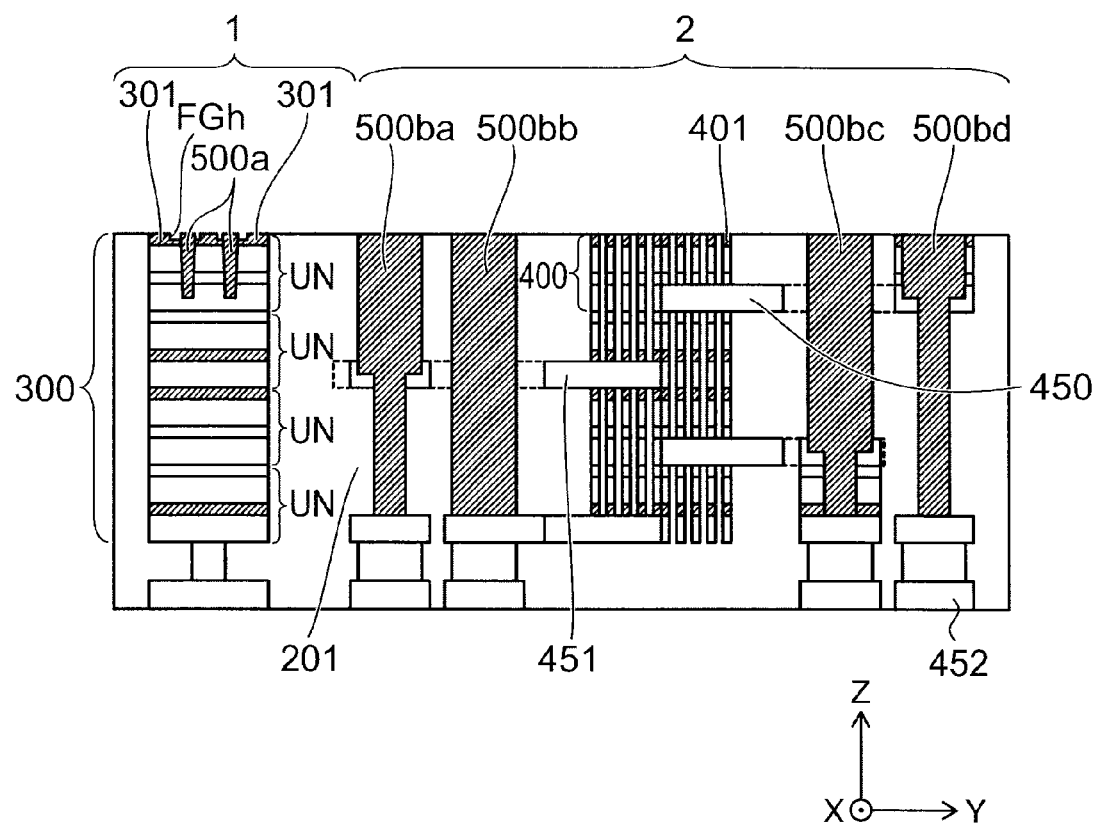
FIG. 37 is a schematic cross-sectional view showing the manufacturing process of the nonvolatile memory device according to the fourth embodiment.

The depth of the trench FGh may be any depth that provides a clear contrast between the insulating layer 203 and the metal-containing layer 500a. For example, the depth of the trench FGh needs only to be lower than the upper surface of the metal-containing layer 301. As shown in FIG. 37, the metal-containing layer 301 may remain in a bottom portion of the trench FGh, for example. The entire insulating layer 203 in the trench FGh may be removed by the etchback of the insulating layer 203.

Thus, in the first to third embodiments, a mark for alignment once formed is eliminated, and another mark can be formed above the eliminated mark. Therefore, the place where marks are arranged can be utilized again, the shrinking of dicing area of a wafer is enabled. So, the number of the nonvolatile memory chip included in the wafer increases.

In the first to third embodiments, when the marks are viewed from above, no marks overlap because the marks on their lower side have been eliminated, and the marks can be observed clearly. In the fourth embodiment, a phenomenon in which patterns containing the same material are located side by side and marks are not lost. Thus, the marks can be observed clearly.

The fourth embodiment can, combined with the second embodiment, arrange a pattern portion MK2 that is intended to be made obscure for reuse and a pattern portion MK4 that is made distinct for mask alignment (see FIG. 35). Similarly, the fourth embodiment can, combined with the third embodiment, arrange a pattern portion MK3 that is intended to be made obscure for reuse and a pattern portion MK4 that is made distinct for mask alignment (see FIG. 36).

Although the embodiments are described above with reference to the specific examples, the embodiments are not limited to these specific examples. That is, design modification appropriately made by a person skilled in the art in regard to the embodiments is within the scope of the embodiments to the extent that the features of the embodiments are included. Components and the disposition, the material, the condition, the shape, and the size or the like included in the specific examples are not limited to illustrations and can be changed appropriately.

The components included in the embodiments described above can be combined to the extent of technical feasibility and the combinations are included in the scope of the embodiments to the extent that the feature of the embodiments is included. Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A method for manufacturing a semiconductor device comprising:
    forming an insulating film above a stacked body including a first layer as an uppermost layer;
    forming a mark having a first opening above the stacked body via the insulating film;
    etching the insulating film exposed from the first opening and the stacked body located under the first opening so as to form a second opening in the insulating film and the stacked body, the mark being transferred to the second opening; and
    forming a second layer including a same material as the first layer in the second opening, wherein the process of the forming the second layer includes:
    forming the second layer in the second opening and forming the second layer on the insulating film; and
    removing the second layer formed on the insulating film and the insulating film so as to expose the first layer from the insulating film and making flush an upper surface of the second layer formed in the second opening and an upper surface of the first layer.

2. The method for manufacturing a semiconductor device according to claim 1, wherein
    after removing the second layer, a third layer and the first layer is exposed, and
    the third layer is made of a material different from that which the first layer is formed.

3. A method for manufacturing a semiconductor device comprising:
    forming an insulating layer covering a first stacked body disposed in a memory cell region and a second stacked body disposed in a mark region, a height of a portion of the insulating layer above the second stacked body being lower than a height of a portion of the insulating layer above the first stacked body;
    forming a mark having a first opening above the second stacked body via the insulating layer;
    etching the insulating layer exposed from the first opening and the second stacked body located under the first opening in the mark region so as to form a second opening in the insulating layer and the second stacked body in the mark region, the mark being transferred to the second opening;
    forming a second layer in the second opening in the mark region and forming the second layer on the insulating layer in the memory cell region and the mark region; and
    removing the second layer formed on the insulating layer and the insulating layer in the memory cell region and leaving the second layer above the insulating layer with a lower height than the height of the portion of the insulating layer above the first stacked body so as to cover the second layer formed in the second opening with the second layer in the mark region.

4. An alignment mark of a semiconductor device comprising third portions having a first portion and a second portion surrounding the first portion and made of a material different from the first portion when viewed from above, an upper surface of the second portion being lower than an upper surface of the first portion,
    wherein the third portions are arranged so as to oppose each other across a fourth portion when viewed from above and a height of the upper surface of the first portion is equal to a height of the upper surface of the fourth portion.

5. An alignment mark of a semiconductor device comprising third portions having a first portion and a second portion surrounding the first portion and made of a material different from the first portion when viewed from above, an upper surface of the second portion being lower than an upper surface of the first portion,
    wherein the third portions are arranged so as to oppose each other across a fourth portion when viewed from above and the first portion and the fourth portion are made of a same material.

* * * * *